(12) United States Patent  (10) Patent No.: US 8,653,793 B2
Ueki et al.  (45) Date of Patent: Feb. 18, 2014

(54) SECONDARY BATTERY SYSTEM

(75) Inventors: Tomoyoshi Ueki, Toyota (JP); Yasuyuki Tamane, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 137 days.

(21) Appl. No.: 13/145,118

(22) PCT Filed: Sep. 25, 2009

(86) PCT No.: PCT/JP2009/066617
§ 371 (c)(1),
(2), (4) Date: Jul. 19, 2011

(87) PCT Pub. No.: WO2011/036760
PCT Pub. Date: Mar. 31, 2011

(65) Prior Publication Data
US 2012/0169288 A1  Jul. 5, 2012

(51) Int. Cl.
*H02J 7/00* (2006.01)
(52) U.S. Cl.
USPC ............................................. 320/132; 702/63
(58) Field of Classification Search
USPC ............................................. 320/132; 702/63
See application file for complete search history.

(56) References Cited

U.S. PATENT DOCUMENTS

2013/0119940 A1* 5/2013 Iriyama et al. ................ 320/134

FOREIGN PATENT DOCUMENTS

| CN | 101048897 | 10/2007 |
|---|---|---|
| CN | 101383438 | 3/2009 |
| JP | 7-294611 | 11/1995 |
| JP | 11-174134 | 7/1999 |
| JP | 11-346444 | 12/1999 |
| JP | 2001-33532 | 2/2001 |
| JP | 2001-86604 | 3/2001 |
| JP | 2003-36889 | 2/2003 |
| JP | 2004-95400 | 3/2004 |
| JP | 2007-292778 | 11/2007 |
| JP | 2008-179284 | 8/2008 |
| JP | 2009-252381 | 10/2009 |
| WO | WO 2006/050117 | 5/2006 |
| WO | WO 2009/122991 | 10/2009 |

OTHER PUBLICATIONS

Degradation Mechanism of Li-ion Cell after Long Cycling-Mechanism and Method for Estimating the Degradation Factor—(Research Report No. T01033.) dated on or before 1996.
Shim, J. et al., "Cycling performance of low-cost lithium ion batteries with natural graphite and LiFePO$_4$." Journal of Power Sources, 119-121, (2003), pp. 955-958.
International Search Report in International Application No. PCT/JP2009/066617; Mailing Date: Dec. 1, 2009.

* cited by examiner

*Primary Examiner* — Richard V Muralidar
(74) *Attorney, Agent, or Firm* — Finnegan, Henderson, Farabow, Garrett & Dunner, LLP

(57) ABSTRACT

A secondary battery system includes a secondary battery containing a positive electrode active material configured from lithium manganate having a spinel crystal structure and a negative electrode active material which undergoes a phase change when charging or discharging. The secondary battery system includes a dQ/dV calculation means (battery controller) for calculating dQ/dV, which is the ratio of the change (dQ) in the accumulated energy (Q) in the secondary battery with respect to the change (dV) in the voltage (V) of the secondary battery when charging or discharging the secondary battery, so as to determine the state of the secondary battery system on the basis of the peaks appearing on the V–dQ/dV curve, which expresses the relationship between the voltage (V) and dQ/dV.

11 Claims, 19 Drawing Sheets

SECONDARY BATTERY SYSTEM

CROSS-REFERENCE TO RELATED APPLICATIONS

This is a national phase application based on the PCT International Patent Application No. PCT/JP2009/066617 filed on Sep. 25, 2009, the entire contents of which are incorporated herein by reference.

TECHNICAL FIELD

This invention relates to a secondary battery system.

BACKGROUND ART

Heretofore, secondary battery systems for detecting the state of secondary batteries have been proposed in various types. For example, according to Patent Literatures 1-4, the state of charge (the amount of stored charge (storage amount) or SOC) of a secondary battery is detected based on the battery voltage of the secondary battery. Patent Literature 4 further shows that the state of degradation of a secondary battery is also detected based on a SOC (State Of Charge) calculated based on the battery voltage, and based on a battery temperature detected by temperature detection means.

CITATION LIST

Patent Literature

Patent Literature 1: JP 2007-292778A
Patent Literature 2: JP 11 (1999)-346444A
Patent Literature 3: JP 7 (1995)-294611A
Patent Literature 4: JP 2001-33532A

SUMMARY OF INVENTION

Technical Problem

However, in the techniques proposed in Patent Literatures 1-4, there is a possibility that the state of charge (the storage amount or SOC) of a secondary battery may not be detected if the variation in battery voltage associated with the variation in storage amount is small. In this case, for the case of the technique proposed in Patent Literature 4, there is a further possibility that the state of degradation of a secondary battery may not be properly detected either.

In addition, in recent years there have been proposed lithium ion secondary batteries whose variation in battery voltage associated with the variation in storage amount is small and which are able to provide stable output characteristic features. As an example, there may be cited a lithium ion secondary battery that comprises a positive active material formed of lithium manganate having a spinel crystal structure. In this type of lithium ion secondary battery, the variation in amount of battery voltage associated with the variation in storage amount is small over the range of capacity of not less than 50% of the entire battery capacity (in particular, the range of capacity corresponding to the SOC range of from 15% to 80%). As to such a secondary battery, there is a possibility that the state thereof may not be detected properly.

Bearing in mind the foregoing current situation, the present invention was developed. Accordingly, an object of the present invention is to provide a secondary battery system capable of detecting the state of a secondary battery system at high accuracy.

Solution to Problem

One aspect of the present invention provides a secondary battery system comprising a secondary battery, wherein the secondary battery includes a positive active material formed of lithium manganate having a spinel crystal structure and a negative active material associated with change in phase due to charging and discharging, the secondary battery system includes dQ/dV calculation means for calculating, during charging and discharging of the secondary battery, a value for dQ/dV representative of a ratio of dQ to dV where dQ is a variation in storage amount Q of the secondary battery and dV is a variation in battery voltage V of the secondary battery, and a state of the secondary battery system is detected based on a peak appearing on a V–dQ/dV curve representative of a relationship between the battery voltage V value and the dQ/dV value.

The above-described secondary battery system is provided with a secondary battery which includes a positive active material formed of lithium manganate with a spinel crystal structure and a negative active material associated with change in phase due to charging and discharging. In this secondary battery, the variation in battery voltage associated with the variation in SOC (the amount of stored charge) is small over the SOC range of from 15% to 80%. More specifically, in such a wide SOC range of from 15% to 80%, the variation in value of the battery voltage is from about 3.8 V only up to about 4.0 V. Accordingly, the value of the battery voltage can be stably maintained high (around 3.9 V) over the SOC range of from 15% to 80%. Therefore, if the secondary battery is operated within the SOC range of from 15% to 80%, this makes it possible for the secondary battery to provide stable, high output power.

Incidentally, in the case where a secondary battery is operated within an SOC range in which the variation in battery voltage is small, it is difficult to properly detect the state of a secondary battery system from a value of the battery voltage of the secondary battery.

However, according to the above-described secondary battery system, the state thereof is detected based on a peak that appears on a V–dQ/dV curve representative of a relationship between the battery voltage (V) value and the (dQ/dV) value. For the case of the secondary battery of the above-described secondary battery system, two definite peaks (a first peak and a second peak) appear on the V–dQ/dV curve within the SOC range of from 15% to 80% (more specifically, at two points one of which lies in the vicinity of SOC 25% and the other of which lies in the vicinity of SOC 70%). Therefore, according to the above-described secondary battery system, even when the secondary battery is operated within the SOC range of from 15% to 80%, the state of the secondary battery system can be detected based on these definite peaks at high accuracy.

It should be noted that what is meant by the phrase "a negative active material associated with change in phase due to charging and discharging" is a negative active material that will change in its crystal structure during charging and discharging. By way of example thereof, carbon materials may be cited. As an example thereof, natural graphite (e.g., graphite), artificial graphite (e.g., mesocarbon microbead), non-graphitizable carbon material etc. may be cited.

For example, the state of the secondary battery, the malfunction of the secondary battery system and other like state can be given as examples of the detectable state of the secondary battery system. And for example, the state of charge (SOC), the decrease in battery capacity (battery capacity when fully charged), the increase in internal resistance and other like state can be given as examples of the state of the secondary battery. In addition, internal micro short-circuiting in the secondary battery, connection defect in the secondary battery (e.g., connection defect in a connection terminal of a cable connected to an external terminal of the secondary battery and connection defect in a connection member for connection between terminals of two secondary batteries) and other like state can be given as examples of the malfunction of the secondary battery system.

Preferably, in accordance with the above-described secondary battery system, the secondary battery system includes judgment means for deciding, based on the battery voltage V value and the dQ/dV value, whether or not the secondary battery reaches a state corresponding to a first peak appearing on the V–dQ/dV curve, and whether or not the secondary battery reaches a state corresponding to a second peak appearing on the V–dQ/dV curve and having the battery voltage V of higher level than the battery voltage V at the first peak, and the state of the secondary battery system is detected based on a measured voltage difference value which is a difference value between a battery voltage value V1 at the time when the judgment means decides that the secondary battery has reached said state corresponding to the first peak and a battery voltage value V2 at the time when the judgment means decides that the secondary battery has reached said state corresponding to the second peak.

According to the above-described secondary battery system, based on the battery voltage V value and the dQ/dV value, the judgment means decides whether or not the secondary battery reaches a state corresponding to the first peak which appears on the V–dQ/dV curve. In particular, the judgment means decides, for example, whether or not the battery voltage V value actually measured in regard to the secondary battery and the dQ/dV value then calculated by the dQ/dV calculation means become values indicative of the first peak on the dQ/dV curve. Furthermore, based on the battery voltage V value and the dQ/dV value, the judgment means decides whether or not the secondary battery reaches a state corresponding to the second peak appearing on the dQ/dV curve. In particular, the judgment means decides, for example, whether or not the battery voltage V value actually measured in regard to the secondary battery and the dQ/dV value then calculated by the dQ/dV calculation means become values indicative of the second peak on the V–dQ/dV curve.

Furthermore, according to the aforesaid secondary battery system, the state of the secondary battery is detected based on the measured voltage difference value which is a difference value (=V2−V1) between the battery voltage value V1 at the time when the judgment means decides that the secondary battery reaches the state corresponding to the first peak and the battery voltage value V2 at the time when the judgment means decides that the secondary battery reaches the state corresponding to the second peak. This makes it possible to detect the state of the secondary battery system (for example, the increase in internal resistance of the secondary battery and the occurrence of a connection defect in the secondary battery) at high accuracy.

In particular, the inventors of the present invention have discovered the following characteristic feature: As the internal resistance of the secondary battery increases, the difference value between the battery voltage value V1 in regard to the first peak of the V–dQ/dV curve and the battery voltage value V2 in regard to the second peak of the V–dQ/dV curve, i.e. the measured voltage difference value (ΔVS=V2−V1), increases. By making use of this characteristic feature, it becomes possible to detect, based on the measured voltage difference value ΔVS, the increase in internal resistance of the secondary battery. In particular, for example, if the measured voltage difference value ΔVS is larger than a reference voltage difference value ΔVK (for example, a difference value, pre-acquired in regard to the secondary battery in its initial state, between the battery voltage value V1 in regard to the first peak and the battery voltage value V2 in regard to the second peak), it can be decided that there is increase in internal resistance of the secondary battery.

In the case where a connection defect is occurring in the secondary battery, the difference value, i.e., the measured voltage difference value ΔVS (=V2−V1), between the battery voltage value V1 in regard to the first peak on the V–dQ/dV curve and the battery voltage value V2 in regard to the second peak on the V–dQ/dV curve becomes extremely increased (for example, the difference value becomes about 1.9 times the reference voltage difference value ΔVK in regard to the initial-state secondary battery), when compared to the case where no connection defect takes place. Besides, the increase in measured voltage difference value ΔVS at the time when a connection defect occurs becomes greater than that at the time when the internal resistance of the secondary battery increases. Additionally, it can be thought that in the secondary battery whose internal resistance has increased, the measured voltage difference value ΔVS will not exceed 1.8 times the reference voltage difference value ΔVK, however much the internal resistance considerably increases. By making utilization of this characteristic feature, it becomes possible to detect, based on the measured voltage difference value ΔVS, a connection defect in the secondary battery. In particular, for example, it can be decided that connection defect is occurring in the secondary battery if the measured voltage difference value ΔVS exceeds a predetermined threshold (for example, 1.8 times greater than the reference voltage difference value ΔVK).

Preferably, in accordance with the above-described secondary battery system, the secondary battery system includes resistance increase detection means for detecting an increase in internal resistance of the secondary battery, and the resistance increase detection means compares the measured voltage difference value with a reference voltage difference value which is prestored in the secondary battery system, the reference voltage difference value being a difference value between a battery voltage value V1 in regard to the first peak and a battery voltage value V2 in regard to the second peak, and relating to the secondary battery in its initial state, if the measured voltage difference value exceeds the reference voltage difference value, then the decision is that there is an increase in internal resistance of the secondary battery.

According to the above-described secondary battery system, by means of the resistance increase detection means, the reference voltage difference value ΔVK prestored in the secondary battery system (i.e., the difference value, preacquired for the secondary battery in its initial state, between the battery voltage value V1 in regard to the first peak and the battery voltage value V2 in regard to the second peak) is compared with the measured voltage difference value ΔVS, and if the measured voltage difference value ΔVS is larger than the reference voltage difference value ΔVK, it is decided that there is an increase in internal resistance of the secondary battery. As described above, as the internal resistance of the secondary battery increases, the difference value between the battery voltage value V1 in regard to the first peak and the battery voltage value V2 in regard to the second peak (the measured voltage difference value ΔVS=V2−V1) likewise increases. This therefore enables the resistance increase detection means to properly detect the increase in internal resistance of the secondary battery.

Preferably, in accordance with any one of the above-described secondary battery systems, the secondary battery system includes connection defect detection means for detecting a connection defect in the secondary battery, and the connection defect detection means compares the measured voltage difference value with a reference voltage difference value which is prestored in the secondary battery system, the reference voltage difference value being a difference value between a battery voltage value V1 in regard to the first peak and a battery voltage value V2 in regard to the second peak, and relating to the secondary battery in its initial state, if the measured voltage difference value exceeds not only the reference voltage difference value, but also exceeds a predetermined threshold, then the decision is that there occurs in the secondary battery a connection defect.

According to the above-described secondary battery system, by means of the connection defect detection means, the reference voltage difference value $\Delta VK$ prestored in the secondary battery system (i.e., the difference value (preacquired for the secondary battery in its initial state) between the battery voltage value V1 in regard to the first peak and the battery voltage value V2 in regard to the second peak) is compared with the measured voltage difference value $\Delta VS$ and if the measured voltage difference value $\Delta VS$ exceeds not only the reference voltage difference value $\Delta VK$, but also exceeds the predetermined threshold (for example, 1.8 times greater than the reference voltage difference value $\Delta VK$), then the decision is that there is occurring in the secondary battery a connection defect. This makes it possible to properly detect a connection defect in the secondary battery. In addition, when a connection defect in the secondary battery is detected, it is preferable to output a signal representing that the connection defect is occurring, to thereby prompt confirmation of the connection.

Preferably, in accordance with any one of the above-described secondary battery systems, the secondary battery system includes judgment means for deciding, based on the battery voltage V value and the dQ/dV value, whether or not the secondary battery reaches a state corresponding to a first peak appearing on the V–dQ/dV curve, and whether or not the secondary battery reaches a state corresponding to a second peak appearing on the V–dQ/dV curve and having the battery voltage V of higher level than the battery voltage V at the first peak, and the state of the secondary battery system is detected based on a measured storage amount difference value which is a difference value between a storage amount Q1 of the secondary battery at the time when the judgment means decides that the secondary battery has reached the aforesaid state corresponding to the first peak and a storage amount Q2 of the secondary battery at the time when the judgment means decides that the secondary battery has reached the aforesaid state corresponding to the second peak.

According to the above-described secondary battery system, based on the battery voltage V value and the dQ/dV value, the judgment means decides whether or not the secondary battery reaches a state corresponding to the first peak which appears on the V–dQ/dV curve. In particular, for example, the judgment means decides whether or not the battery voltage V value actually measured in regard to the secondary battery and the dQ/dV value then calculated by the dQ/dV calculation means become values indicative of the first peak on the V–dQ/dV curve. Furthermore, based on the battery voltage V value and the dQ/dV value, the judgment means decides whether or not the secondary battery reaches a state corresponding to the second peak which appears on the V–dQ/dV curve. In particular, for example, the judgment means decides whether or not the battery voltage V value actually measured in regard to the secondary battery and the dQ/dV value then calculated by the dQ/dV calculation means become values indicative of the second peak on the V–dQ/dV curve.

Furthermore, according to the above-described secondary battery system, the state of the secondary battery system is detected based on the measured voltage difference value which is a difference value (=Q2−Q1) between the storage amount Q1 of the secondary battery at the time when the judgment means decides that the secondary battery reaches the state corresponding to the first peak and the storage amount Q2 of the secondary battery at the time when the judgment means decides that the secondary battery reaches the state corresponding to the second peak. This makes it possible that the state of the secondary battery system (for example, the decrease in battery capacity of the secondary battery and the occurrence of internal micro short-circuiting in the secondary battery) is detected at high accuracy.

In particular, the inventors of the present invention have discovered the following characteristic feature: As the capacity of the secondary battery decreases, the difference value between the storage amount Q1 at the time when the secondary battery reaches the state corresponding to the first peak and the storage amount Q2 at the time when the secondary battery reaches the state corresponding to the second peak, i.e., the measured storage amount difference value $\Delta QS=Q2-Q1$, diminishes. By making use of the characteristic feature, it becomes possible to detect, based on the measured storage amount $\Delta QS$, the decrease in capacity of the secondary battery. In particular, for example, in the case where the measured storage amount $\Delta QS$ is smaller than a reference storage amount difference value $\Delta QK$ (for example, a difference value, pre-acquired in regard to the secondary battery in its initial state, between the storage amount Q1 and the storage amount Q2), then the decision is that there is a decrease in capacity of the secondary battery.

In the case where there is the occurrence of internal micro short-circuiting in the secondary battery, the difference value between the storage amount Q1 at the time when the secondary battery reaches a state corresponding to the first peak and the storage amount Q2 at the time when the secondary battery reaches a state corresponding to the second peak, i.e., the measured storage amount difference value $\Delta QS=Q2-Q1$, considerably decreases (for example, down to about 74% of the reference storage amount difference value $\Delta QK$ in regard to the secondary battery in its initial state), as compared to the secondary battery free from the occurrence of internal microshortcutting. In addition, the measured voltage difference value $\Delta VS$ of the secondary battery with the occurrence of internal micro short-circuiting becomes larger than the measured voltage difference value $\Delta VS$ of the secondary battery whose capacity has dropped. Besides, for the case of such a capacity-dropped secondary battery, it can be thought that the measured storage amount difference value $\Delta QS$ will never become lower than 75% of the reference storage amount difference value $\Delta QK$, however much the capacity drops. By making use of this characteristic feature, the secondary battery is detected for the occurrence of internal micro short-circuiting, based on the measured storage amount difference value $\Delta QS$. In particular, for example, if the measured storage amount difference value $\Delta QS$ falls below a predetermined threshold (for example, below 75% of the reference storage amount difference value $\Delta QK$), then the decision is that there is an occurrence of internal micro short-circuiting in the secondary battery.

Preferably, in accordance with the above-described secondary battery system, the secondary battery system includes capacity decrease detection means for detecting a decrease in battery capacity of the secondary battery, and the capacity decrease detection means compares the measured storage amount difference value with a reference storage amount difference value which is prestored in the secondary battery system, the reference storage amount difference value being a difference value between a storage amount Q1 of the secondary battery at the first peak (i.e., a storage amount Q1 of the secondary battery at the time when the secondary battery has reached a state corresponding to the first peak) and a storage amount Q2 of the secondary battery at the second peak (i.e., a storage amount Q2 of the secondary battery at the time when the secondary battery has reached a state corresponding to the second peak), and relating to the secondary battery in its initial state, if the measured storage amount difference value is smaller than the reference storage amount difference value, then the decision is that there is a decrease in battery capacity of the secondary battery.

According to the above-described secondary battery system, the capacity decrease detection means makes a comparison between the reference storage amount difference value $\Delta QK$ prestored in the secondary battery system (i.e., the difference value, preacquired for the secondary battery in its initial state, between the storage amount Q1 and the storage amount Q2), and the measured storage amount difference value $\Delta QS$, and if the measured storage amount difference value $\Delta QS$ is smaller than the reference storage amount difference value $\Delta QK$, then the decision is that there is a decrease in capacity of the secondary battery. As described above, as the capacity of the secondary battery decreases, the difference value between the storage amount Q1 and the storage amount Q2 (i.e., the measured storage amount difference value $\Delta QS=Q2-Q1$) diminishes, and the capacity decrease detection means is able to properly detect a decrease in capacity of the secondary battery.

Preferably, in accordance with any one of the above-described secondary battery systems, the secondary battery system includes micro short-circuiting detection means for detecting internal micro short-circuiting in the secondary battery, the micro short-circuiting detection means compares the measured storage amount difference value with a reference storage amount difference value which is prestored in the secondary battery system, the reference storage amount difference value being a difference value between a storage amount Q1 of the secondary battery in regard to the first peak (i.e., a storage amount Q1 of the secondary battery at the time when the secondary battery has reached the aforesaid state corresponding to the first peak) and a storage amount Q2 of the secondary battery in regard to the second peak (i.e., a storage amount Q2 of the secondary battery at the time when the secondary battery has reached the aforesaid state corresponding to the second peak), and relating to the secondary battery in its initial state, if the measured storage amount difference value falls below not only the reference storage amount difference value, but also below a predetermined threshold, then the decision is that there is an occurrence of internal micro short-circuiting in the secondary battery.

According to the secondary battery system, the micro short-circuiting detection means makes a comparison between the reference storage amount difference value $\Delta QK$ prestored in the secondary battery system (i.e., the difference value, preacquired for the secondary battery in its initial state) and the measured storage amount difference value $\Delta QS$, and if the measured storage amount difference value $\Delta QS$ falls below not only the reference storage amount difference value $\Delta QK$, but also below the predetermined threshold, then the decision is that there is an occurrence of internal short-circuiting in the secondary battery. This makes it possible to properly detect the occurrence of internal micro short-circuiting in the secondary battery. It is preferred, when the occurrence of internal micro short-circuiting of the secondary battery is detected, to output a signal representing that the secondary battery is malfunctioning, thereby to prompt replacement of the secondary battery.

Preferably, in accordance with any one of the above-described secondary battery systems, the secondary battery system includes control means for controlling charging and discharging of the secondary battery, and the control means controls the charging and discharging of the secondary battery in order that the battery voltage V of the secondary battery has a value not exceeding a battery voltage value V2 at the second peak that is the larger, in battery voltage V, of the first and the second peaks appearing on the V−dQ/dV curve.

The secondary battery in accordance with the above-described secondary battery system includes, as mentioned above, the positive active material formed of lithium manganate having the spinel crystal structure. The problem with such a type of secondary battery is that $Mn^{2+}$ solved out or eluted from the positive electrode covers the surface of the negative electrode and extracts Li intercalated into the negative electrode, thereby resulting in that there is degradation in performance of the secondary battery.

In regard to this, the inventors of the present application have discovered that the solving-out or elution of $Mn^{2+}$ is contributed to by the change in crystal structure associated with the variation in valence of Mn ($Mn^{3+} \rightarrow Mn^{4+}$) in the positive active material associated with charging and discharging. The inventors of the present application have further found out that the second peak appearing on the V−dQ/dV curve is contributed to by the change in crystal structure of the positive active material. From these findings, the inventors of the present application thought that if the battery voltage V value of the secondary battery reached and went beyond the battery voltage value V2 at the second peak appearing on the V−dQ/dV curve, this would cause $Mn^{2+}$ to solve out from the positive electrode, thereby resulting in degradation in battery performance.

Therefore, in the above-described secondary battery system, the control means takes control of the charging and discharging of the second battery so that the battery voltage V value of the secondary battery will not exceed the battery voltage value V2 at the second peak appearing on the V−dQ/dV curve. This makes it possible to prevent the solving-out of $Mn^{2+}$ from the positive electrode, thereby making it possible to prevent the secondary battery from undergoing degradation in performance due to the solving-out of $Mn^{2+}$.

Preferably, in accordance with the above-described secondary battery system, the secondary battery system includes judgment means for deciding, based on the battery voltage V value and the dQ/dV value, whether or not the secondary battery reaches a state corresponding to the second peak on the V−dQ/dV curve, and if the judgment means decides that the secondary battery has reached the aforesaid state corresponding to the second peak during charging of the secondary battery, the control means brings the charging of the secondary battery to a stop and takes control of excessive discharging with respect to the secondary battery.

According to the above-described secondary battery system, based on the battery voltage V value and the dQ/dV value, the judgment means makes a judgmental decision regarding whether or not the secondary battery reaches the state corresponding to the second peak appearing on the V−dQ/dV curve. In particular, for example, the judgment means decides whether or not the battery voltage V value actually measured in regard to the secondary battery and the dQ/dV value then calculated by the dQ/dV calculation means become values indicative of the second peak on the V–dQ/dV curve.

Further, in the above-described secondary battery system, once the judgment means decides that the secondary battery reaches the state corresponding to the second state during charging of the secondary battery, the control means brings the charging of the secondary battery to a stop for the controlling of excessive discharging. In particular, the amount of discharging is made larger than the amount of charging and the charging and discharging of the secondary battery is carried out. This makes it possible to render the battery voltage value of the secondary battery smaller than the battery voltage value V2 at the second peak on the V–dQ/dV curve. Accordingly, the solving-out of $Mn^{2+}$ from the positive electrode can be prevented.

DESCRIPTION OF EMBODIMENTS

Embodiment 1

Next, a detailed description will be given regarding Embodiment 1 of the present invention with reference to the drawings.

Figure 1:
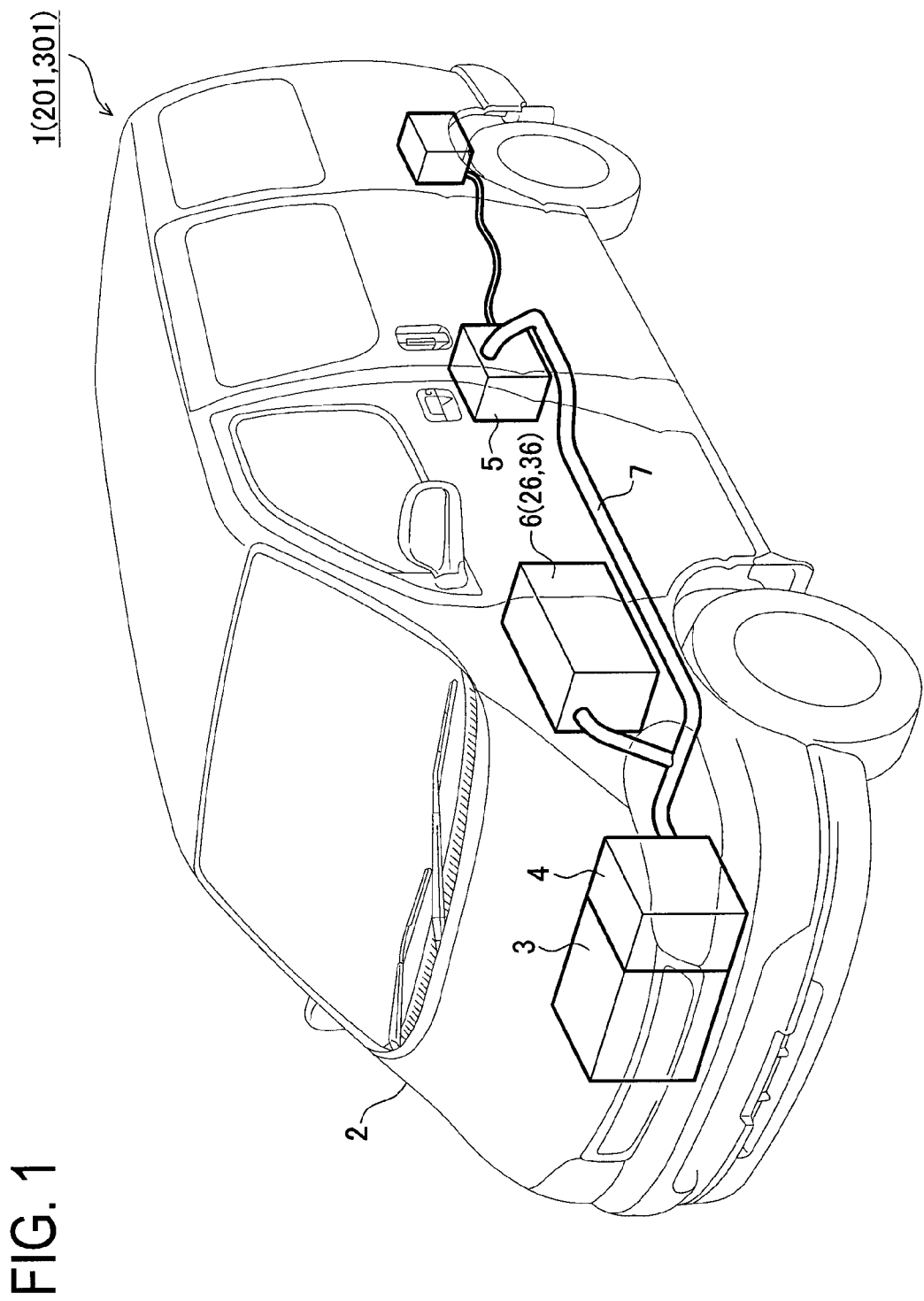
FIG. 1 is a schematic diagram of a hybrid electric vehicle in Embodiments 1-3 of the present invention.

Referring to FIG. 1, there is shown a hybrid electric vehicle 1 having a vehicle body 2, an engine 3, a front motor 4, a rear motor 5, a cable 7 and a secondary battery system 6. The hybrid electric vehicle 1 is driven by parallel use of the engine 3, the front motor 4 and the rear motor 5. More specifically, the hybrid electric vehicle 1 is configured such that it uses the engine 3, the front motor 4 and the rear motor 5 to travel by conventional means wherein the secondary battery system 6 serves as a drive power supply for the front motor 4 and the rear motor 5.

Figure 2:
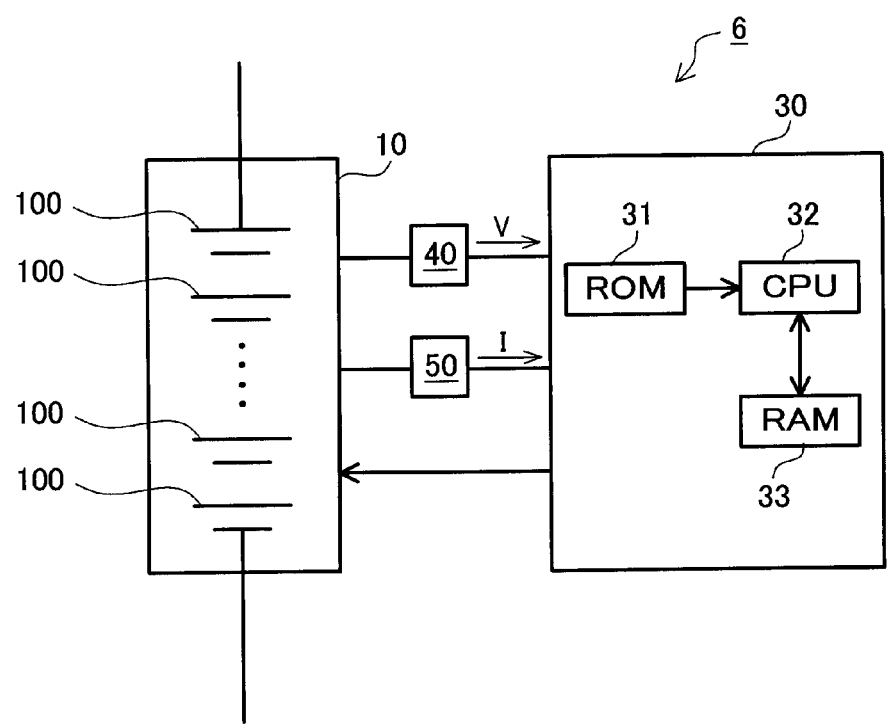
FIG. 2 is a schematic diagram of a secondary battery system in Embodiment 1.

Of the foregoing components, the secondary battery system 6 of Embodiment 1 is mounted onto the vehicle body 2 of the hybrid electric vehicle 1 and is connected by the cable 7 to the front motor 4 and the rear motor 5. As shown in FIG. 2, the secondary battery system 6 is provided with an assembled battery 10 composed of a plurality of secondary batteries 100 (cells) which are electrically connected together in series, a voltage detection means 40, an electric current detection means 50 and a battery controller 30. The battery controller 30 has a ROM 31, a CPU 32, a RAM 33, etc.

The electric current detection means 50 detects an electric current I value, i.e., the value of electric current flowing through the secondary batteries 100 constituting the assembled battery 10. On the other hand, the voltage detection means 40 detects a battery voltage (terminal voltage) V for each of the secondary batteries 100 constituting the assembled battery 10.

The battery controller 30 takes control of the charging and discharging of the secondary battery 100 constituting the assembled battery 10. In particular, for example, when the hybrid electric vehicle 1 is being driven, the exchange of electricity between the assembled battery 10 (the secondary battery 100), and the front motor 4 and the rear motor 5 is controlled. More specifically, the battery controller 30 controls the assembled battery 10 (the secondary battery 100) to deliver electricity, for example, when the accelerator of the hybrid electric vehicle 1 is pressed down. The electricity thus delivered is supplied through an inverter (not shown) to the front motor 4 and to the rear motor 5. On the other hand, when the brake of the hybrid electric vehicle 1 is pressed down, electricity generated by the regeneration brake is supplied by the battery controller 30 to the assembled battery 10 (the secondary battery 100), to thereby charge each of the secondary batteries 100 constituting the assembled battery 10.

Figure 3:
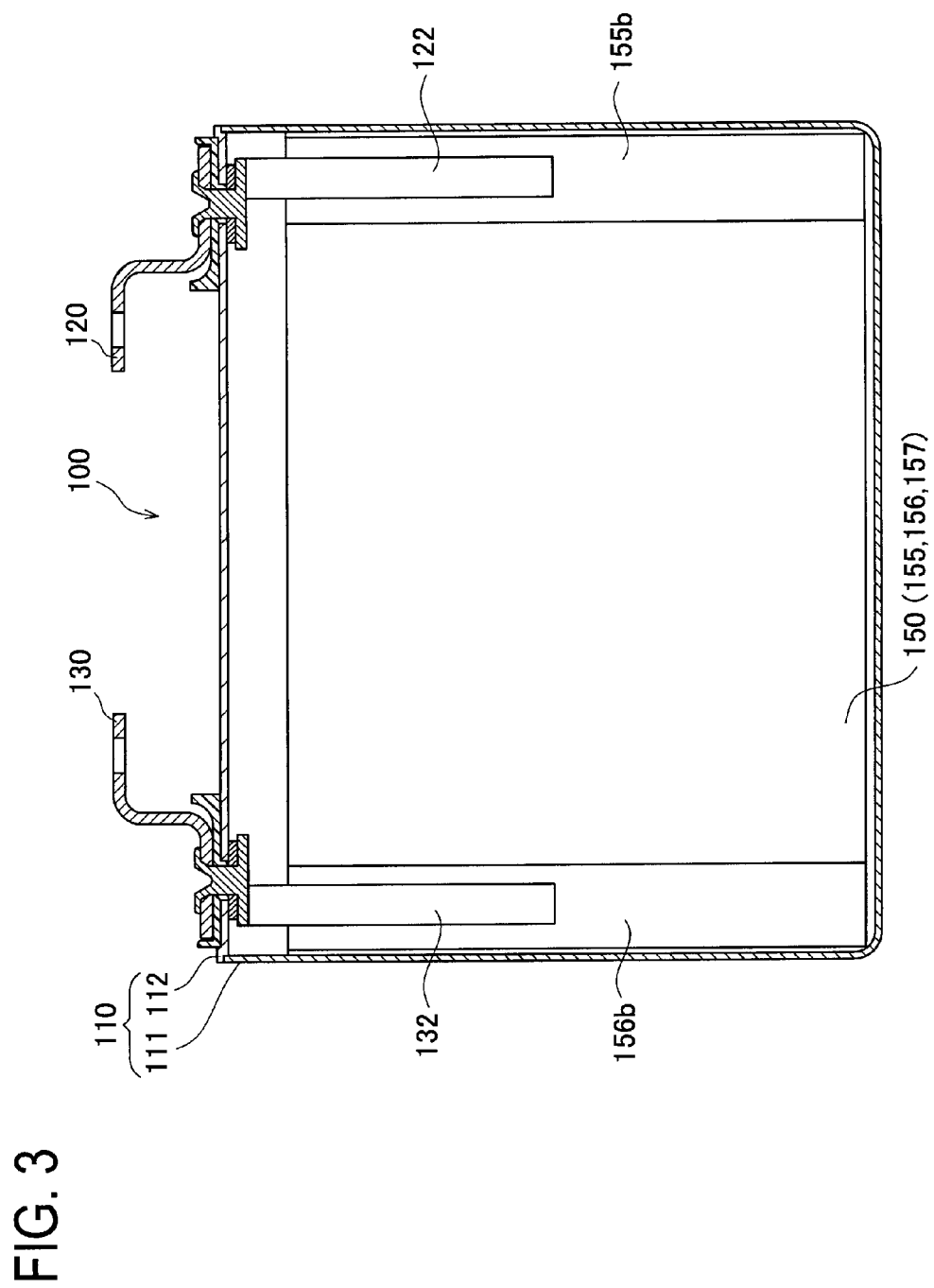
FIG. 3 is a cross-sectional view of a secondary battery in Embodiments 1-3.

As shown in FIG. 3, the secondary battery 100 is a lithium ion secondary battery of the prismatic sealed type which includes a rectangular parallelepiped battery casing 110, a positive terminal 120 and a negative terminal 130. Of these components, the battery casing 110 is formed of metal and includes a rectangular housing section 111 which defines a housing space shaped like a rectangular parallelepiped and a cover section 112 formed of metal. Housed in the inside of the battery casing 110 (the rectangular housing section 111) are an electrode body 150, a positive current collector 122, a negative current collector 132 etc.

Figure 4:
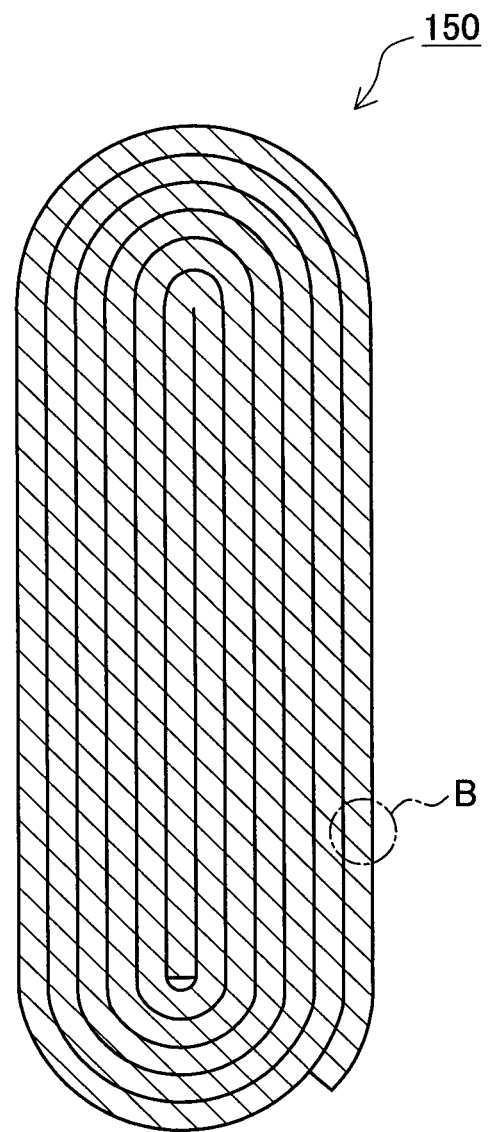
FIG. 4 is a cross-sectional view of an electrode body in the secondary battery.
Figure 5:
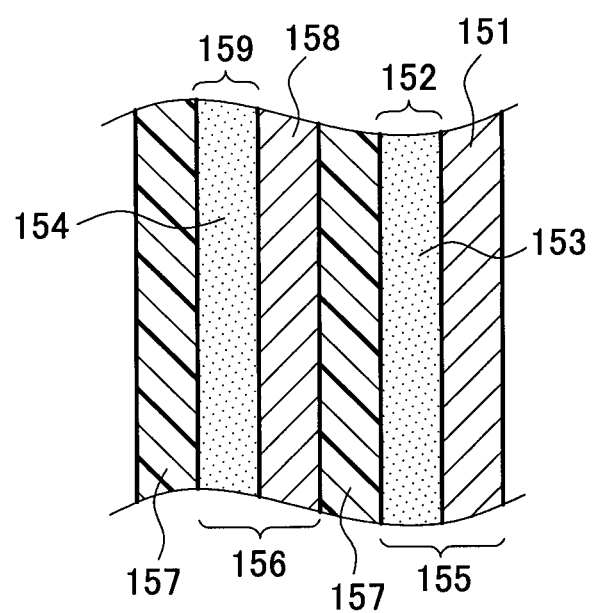
FIG. 5 is a partially enlarged cross-sectional view of the electrode body, and corresponds to a view showing in an enlarged manner a section B of FIG. 4.

As shown in FIGS. 4 and 5, the electrode body 150 is shaped like a long circle or oval in cross section and is a wound body of the flattened type formed by winding of a positive electrode plate 155, a negative electrode plate 156 and a separator 157 which are in the form of a sheet. The electrode body 150 has a positive electrode wound part 155b and a negative electrode wound part 156b. The positive electrode wound part 155b is located at one of the axis-wise ends of the electrode body 150 (i.e., a horizontal right-hand end relative to FIG. 3) and is vorticosely overlapped with only a part of the positive electrode plate 155. The negative electrode wound part 156b is located at the other of the axis-wise ends of the electrode body 150 (i.e., a horizontal left-hand end relative to FIG. 3) and is vorticosely overlapped with only a part of the negative electrode plate 156. The positive electrode plate 155 excluding the positive electrode wound part 155b is coated with a positive material mixture 152 which contains a positive active material 153 (see FIG. 5). Likewise, the negative electrode plate 156 excluding the negative electrode wound part 156b is coated with a negative material mixture 159 which contains a negative active material 154 (see FIG. 5). The positive electrode wound part 155b is electrically connected through the positive current collector 122 to the positive terminal 120. The negative electrode wound part 156b is electrically connected through the negative current collector 132 to the negative terminal 130.

In Embodiment 1, lithium manganate having a spinel crystal structure is used as the positive active material 153. In addition, carbon material (more specifically, graphite) is used as the negative active material 154. The negative active material 154 is an active material associated with phase change by charging and discharging.

Figure 6:
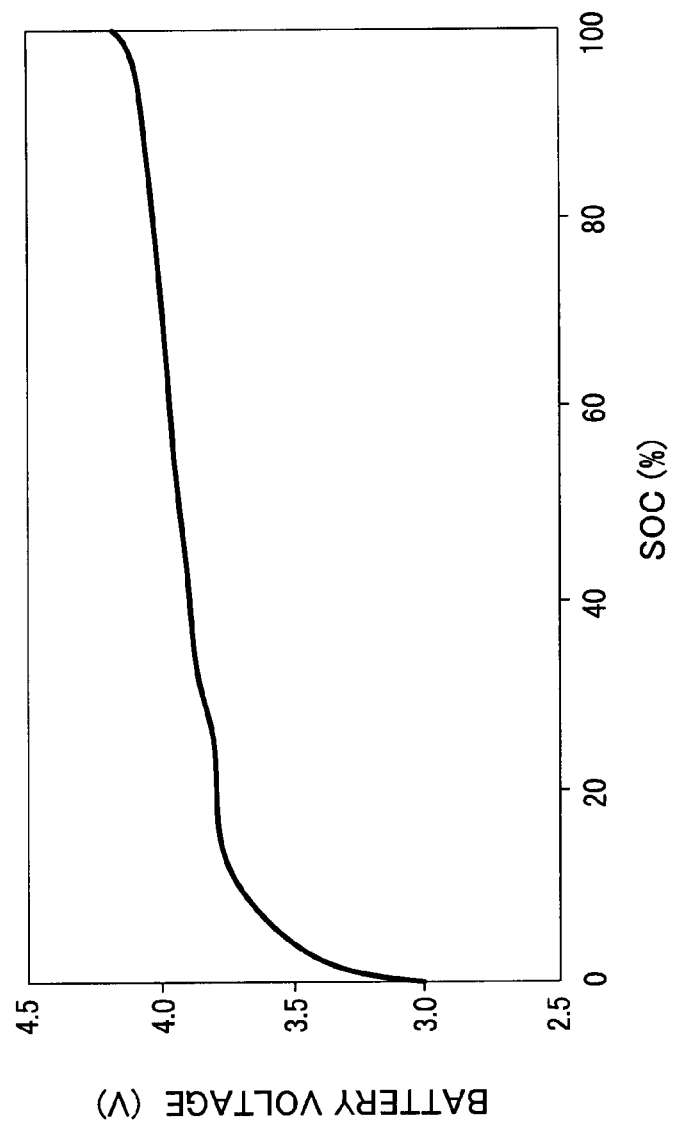
FIG. 6 is a diagram representing an SOC versus battery voltage relationship for the secondary battery.

Here, referring to FIG. 6, there is shown a relationship between SOC (State Of Charge) and V (the battery voltage value) in the secondary battery 100 in its initial state. As can be seen from FIG. 6, the variation in battery voltage of the secondary battery 100 associated with the variation in SOC (the amount of stored charge) becomes lower over the SOC range of from 15% to 80%. More specifically, in this wide SOC range of from 15% to 80%, the battery voltage value varies from about 3.8 V only to about 4.0 V. Accordingly, the battery voltage value can stably be retained high at around 3.9 V over the SOC range of from 15% to 80%. Therefore, if the secondary battery 100 is operated within the SOC range of from 15% to 80%, this makes it possible to stably provide high output power.

Figure 9:
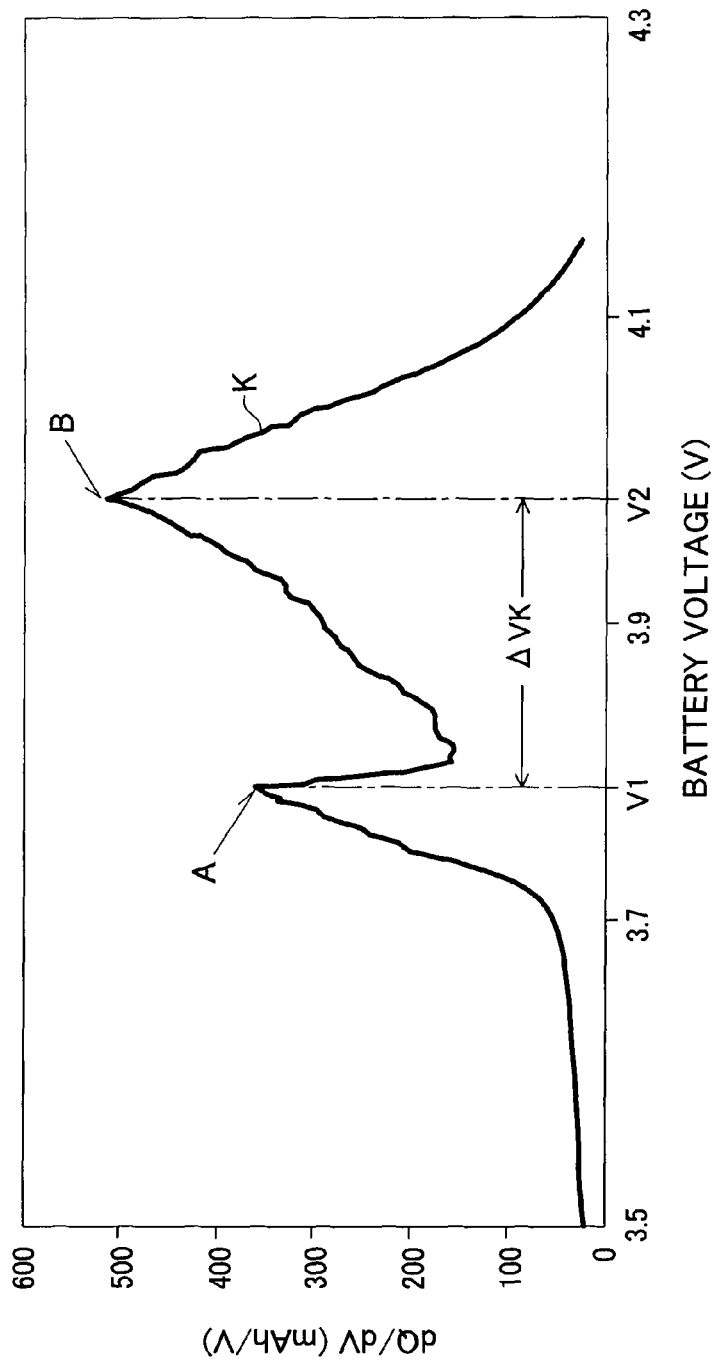
FIG. 9 is a chart representing a V–dQ/dV curve for the secondary battery in its initial state.

Furthermore, referring to FIG. 9, there is shown a V–dQ/dV curve K representing a relationship between the battery voltage V and the dQ/dV value for the secondary battery 100 in its initial state. This V–dQ/dV curve K corresponds to a curve representing a relationship between the dQ/dV value found by differentiating Q (i.e., the amount of stored charge) with respect to V (i.e., the battery voltage) for the functions shown in FIG. 6 and the battery voltage V value corresponding to that dQ/dV value. In particular, at the time of preparing the curve of FIG. 6, the dQ/dV value (i.e., the ratio of dQ to dV where dQ is the variation in storage amount Q and dV is the variation in battery voltage V) is calculated based on the storage amount Q and the battery voltage V which are acquired every given time interval T (for example, every one second), and there is represented in FIG. 9 a dQ/dV value versus battery voltage V relationship.

As shown in FIG. 9, two definite peaks, namely a first peak A and a second peak B, appear on the V–dQ/dV curve K. More specifically, upon arrival of the battery voltage V value at about 3.8 V, the first peak A appears. When the battery voltage V value reaches about 3.8 V, the SOC of the secondary battery 100 reaches about 25% (see FIG. 6). Further, upon arrival of the battery voltage V value at about 4.0 V, the second peak B appears. In addition, when the battery voltage V value reaches about 4.0 V, the SOC of the secondary battery 100 reaches about 75% (see FIG. 6).

Incidentally, as described above, in the secondary battery 100, the variation in battery voltage V associated with the variation in SOC (the storage amount Q) is small over the SOC range of from 15% to 80%. In this SOC range in which the variation in battery voltage V is small, it is difficult to properly detect, based on the battery voltage V, the state of the secondary battery system (the secondary battery 100).

However, in the SOC range (see the SOC range of from 15% to 80% in FIG. 6) in which the variation in battery voltage V is small, two definite peaks, i.e., the first peak A and the second peak B, appear on the V–dQ/dV curve K. As described above, the first peak A appears at SOC 25% and the second peak B appears at SOC 75%. In the secondary battery system 6 of Embodiment 1, as will be described later, the state of the secondary battery 100 is detected based on these definite peaks (the first peak A and the second peak B). This makes it possible to detect states of the secondary battery system 6 (the secondary battery 100) at high accuracy and more specifically, it becomes possible to detect the SOC of the secondary battery 100, the increase in internal resistance of the secondary battery 100 and the connection defect of the secondary battery 100.

Next, a detailed description will be given regarding the charging and discharging control and the state detection of the secondary battery 100 of the secondary battery system 6.

The battery controller 30 of the secondary battery system 6 integrates the electric current I value detected every given time interval T by the electric current detection means 50, calculates the amount of charge or discharge of the secondary battery 100 and estimates the storage amount Q of the secondary battery 100 from the calculated amount of charge or discharge. Further, based on the estimated storage amount Q and the battery capacity of the secondary battery 100, the SOC (%) of the secondary battery 100 is estimated. Furthermore, the battery controller 30 obtains the battery voltage V of each secondary battery 100 detected every given time interval T by the voltage detection means 40, in synchronization with the electric current integration.

Furthermore, during charging and discharging of the assembled battery 10 (the secondary battery 100), the battery controller 30 calculates a value for dQ/dV, i.e., the ratio of dQ to dV where dQ is the variation in storage amount Q of the secondary battery 100 and dV is the variation in battery voltage V of the secondary battery 100. Stated in another way, during charging and discharging of the secondary battery 100, the storage amount Q of the secondary battery 100 is differentiated with respect to the battery voltage V for calculating a value for dQ/dV. More specifically, during charging and discharging of the secondary battery 100, the battery voltage V and the storage amount Q are acquired every given time interval T while at the same time the variation dV in battery voltage V and the variation dQ in storage amount Q are calculated every given time interval T. And based on these calculations, the value for dQ/dV with respect to every given time interval T is calculated.

In addition, the ROM 31 of the battery controller 30 stores a V–dQ/dV curve K representative of a battery voltage V versus dQ/dV relationship acquired for the secondary battery 100 (see FIG. 9). The ROM 31 further stores an SOC value (SOC 25%) at the first peak A on the V–dQ/dV curve K and an SOC value (SOC 75%) at the second peak B on the V–dQ/dV curve K. The ROM 31 still further stores a reference voltage difference value ΔVK (=V2−V1=0.2 V), i.e., a difference value between the battery voltage value V1 (3.8 V) at the first peak A on the V–dQ/dV curve K and the battery voltage value V2 (4.0 V) at the second peak B on the V–dQ/dV curve K.

Furthermore, based on the battery voltage V detected every given time interval T and the dQ/dV value calculated every given time interval T, the battery controller 30 draws or creates in real time a V–dQ/dV curve. And by comparison (by pattern matching) between the V–dQ/dV curve thus drawn and the V–dQ/dV curve K (see FIG. 9) stored in the ROM 31, the battery controller 30 decides whether or not the secondary battery 100 reaches a state corresponding to the first peak A or whether or not the secondary battery 100 reaches a state corresponding to the second peak B on the V–dQ/dV curve. In other words, the battery controller 30 decides whether or not the battery voltage V value detected every given time interval T and the dQ/dV value calculated every given time interval T become values indicative of either the first peak A or the second peak B on the V–dQ/dV curve.

Figure 7:
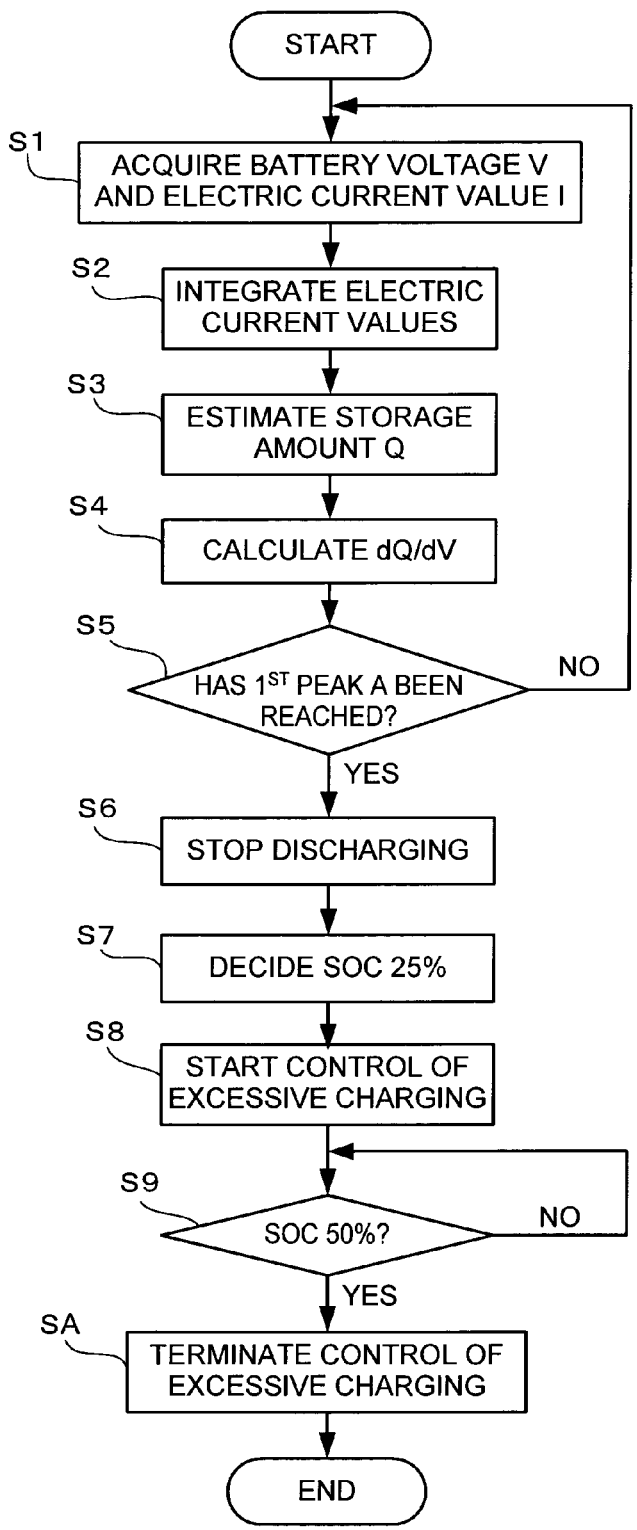
FIG. 7 is a flowchart showing a flow of controlling charging and discharging of and detecting a state of the secondary battery in Embodiment 1.
Figure 8:
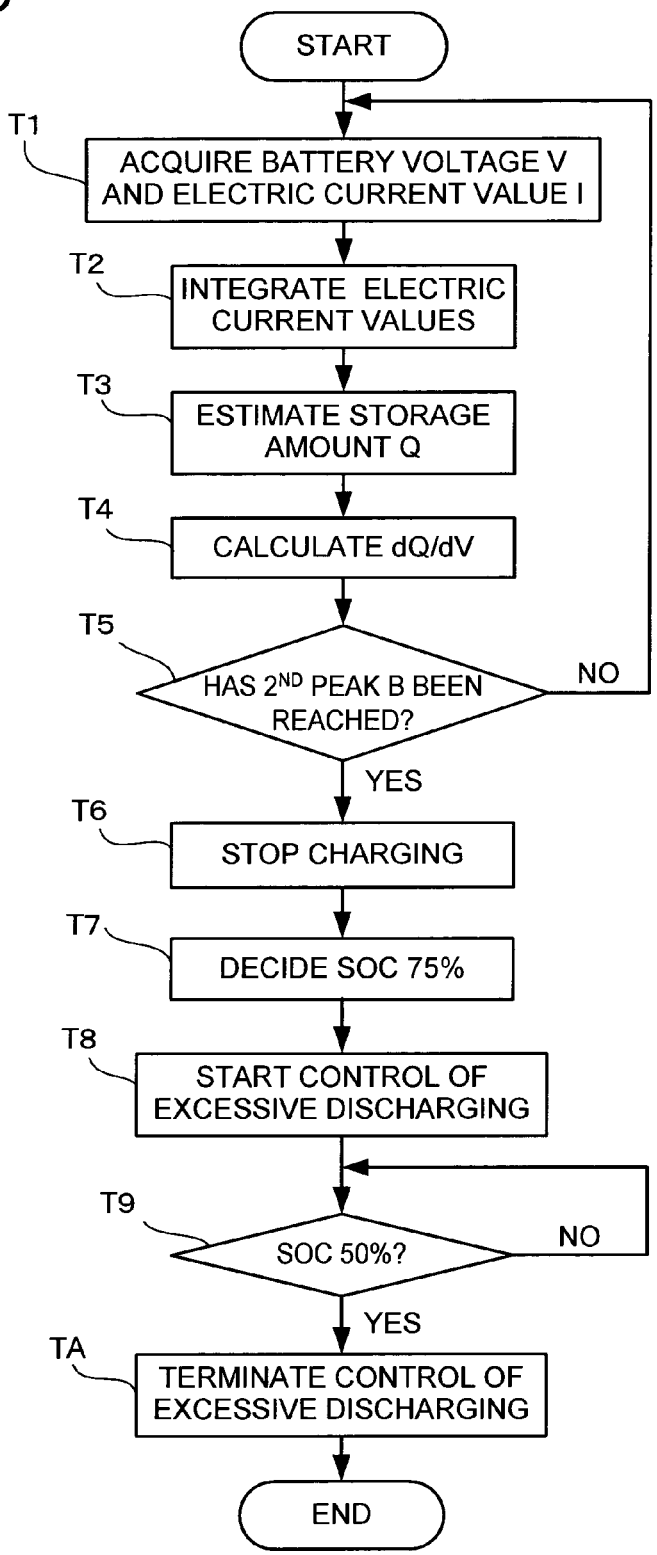
FIG. 8 is another flowchart showing a flow of controlling the charging and discharging of and detecting the state of the secondary battery in Embodiment 1.

Here, referring now to FIGS. 7 and 8, a more specific description will be given regarding the charging and discharging control and the state (SOC) detection of the secondary battery 100. FIG. 7 is a flowchart representative of the charging and discharging control and the state detection of the secondary battery 100 after start-up of the discharging thereof. On the other hand, FIG. 8 is a flowchart representative of the charging and discharging control and the state detection of the secondary battery 100 after start-up of the charging thereof.

Upon startup of the discharging of the assembled battery 10 (the secondary battery 100), the battery controller 30 acquires a value for the battery voltage V of each secondary battery 100 detected by the voltage detection means 40 and a value for the electric current I (a value for electric current flowing in the secondary battery 100) detected by the electric current detection means 50 (step S1 of FIG. 7). In Embodiment 1, further, the battery controller 30 acquires a value for the battery voltage V and a value for the electric current I every given time interval T (for example, every one second).

Next, the procedure proceeds to step S2 in which the battery controller 30 integrates an value for the electric current I detected by the electric current detection means 50, to thereby calculate an amount of charge of each secondary battery 100. Next, the procedure proceeds to step S3 in which based on the calculated amount of charge, the battery controller 30 estimates an amount of electricity (the storage amount Q) stored in each secondary battery 100. Additionally, in Embodiment 1, the storage amount Q with respect to every given time interval T is estimated based on the value of the electric current I detected every given time interval T (for example, every one second).

Next, the procedure proceeds to step S4 in which the dQ/dV value (i.e., the ratio of dQ to dV where dQ is the variation in storage amount Q and dV is the variation in battery voltage V) is calculated for each secondary battery 100. Stated in another way, the storage amount Q of the secondary battery 100 is differentiated with respect to the corresponding battery voltage V value, to thereby calculate the dQ/dV value. In particular, for each secondary battery 100, the variation dV in battery voltage V and the variation dQ in storage amount Q with respect to every given time interval T are calculated based on the battery voltage V value and the storage amount Q acquired every given time interval T. And based on these calculations, the dQ/dV value with respect to every given time interval T is calculated.

Subsequently, the procedure proceeds to step S5 in which it is decided whether or not the secondary battery 100 reaches a state corresponding to the first peak A on the V–dQ/dV curve. If the decision is that the secondary battery 100 has not yet reached the state corresponding to the first peak A (No), then the processes of steps S1-S5 are repeatedly carried out for each predetermined time interval during discharging of the secondary battery 100.

On the other hand, if in step S5, it is decided that the secondary battery 100 has reached the state corresponding to the first peak A (Yes), then the procedure proceeds to step S6 in which the battery controller 30 stops the discharging of the secondary battery 100. In step S7, the battery controller 30 then decides that the secondary battery 100 has reached SOC 25%. Since the first peak A is a definite peak, this enables the battery controller 30 to decide, at high accuracy, whether or not the secondary battery 100 reaches the state corresponding to the first peak A. Therefore, according to Embodiment 1, the reaching of the secondary battery 100 at SOC 25% can be detected at high accuracy.

Next, the procedure proceeds to step S8 in which the battery controller 30 starts taking control of the excessive charging of the assembled battery 10 (the secondary battery 100). In particular, with the amount of charge made larger relative to the amount of discharge, the secondary battery 100 is charged and discharged. This makes it possible to achieve gradual increase in SOC without making the SOC of the secondary battery 100 less than 25%. Subsequently, the procedure proceeds to step S9 in which it is decided whether or not the SOC of the secondary battery 100 reaches 50%. Note here that the SOC of the secondary battery 100 is, as described above, estimated every given time interval by the battery controller 30.

If in step S9, it is decided that the SOC has not yet reached 50% (No), the battery controller 30 continues to take control of the excessive charging. On the other hand, if in step S9, it is decided that the SOC has reached 50% (Yes), then the procedure proceeds to step SA and the excessive charging control is terminated to return to the normal charging and discharging control.

Upon startup of the charging of the assembled battery 10 (the secondary battery 100), the battery controller 30 acquires a value for the battery voltage V of each secondary battery 100 detected by the voltage detection means 40 and a value for the electric current I (a value for electric current flowing in the secondary battery 100) detected by the electric current detection means 50 (step T1 shown in FIG. 8). In addition, in Embodiment 1, the battery controller 30 acquires a value for the battery voltage V and a value for the electric current I every given time interval T (for example, every one second).

Next, the procedure proceeds to step T2 in which the battery controller 30 integrates a value for the electric current I detected by the electric current detection means 50, to thereby calculate an amount of charge of each secondary battery 100. Next, the procedure proceeds to step S3 in which based on the calculated amount of charge, the battery controller 30 estimates an amount of electricity (the storage amount Q) stored in each secondary battery 100. Additionally, in Embodiment 1, the storage amount Q with respect to every given time interval T is estimated based on the electric current I value detected every given time interval T (for example, every one second).

Next, the procedure proceeds to step T4 in which the dQ/dV value (i.e., the ratio of dQ to dV where dQ is the variation in storage amount Q and dV is the variation in battery voltage V) is calculated for each secondary battery 100. Stated in another way, the storage amount Q of the secondary battery 100 is differentiated with respect to the corresponding battery voltage V value, to thereby calculate the dQ/dV value. In particular, for each secondary battery 100, the variation dV in battery voltage V and the variation dQ in storage amount Q with respect to every given time interval T are calculated based on the battery voltage V value and the storage amount Q acquired every given time interval T. And based on these calculations, the dQ/dV value with respect to every given time interval T is calculated.

Subsequently, the procedure proceeds to step T5 in which it is decided whether or not the secondary battery 100 reaches a state corresponding to the second peak B on the V–dQ/dV curve. If the decision is that the secondary battery 100 has not yet reached the state corresponding to the second peak B (No), then the processes of steps T1-T5 are repeatedly carried out for each predetermined time interval during charging of the secondary battery 100.

On the other hand, if in step T5, it is decided that the secondary battery 100 has reached the state corresponding to the second peak B (Yes), then the procedure proceeds to step T6 in which the battery controller 30 stops the charging of the secondary battery 100. Next, the procedure proceeds to step T7 in which the battery controller 30 decides that the secondary battery 100 has reached SOC 75%. Since the second peak B is a definite peak, this enables the battery controller 30 to decide, at high accuracy, whether or not the secondary battery 100 reaches the state corresponding to the second peak B. Therefore, according to Embodiment 1, the reaching of the secondary battery 100 at SOC 75% can be detected at high accuracy.

The procedure then proceeds to step T8 in which the battery controller 30 starts taking control of the excessive discharging of the assembled battery 10 (the secondary battery 100). In particular, with the amount of discharge made larger relative to the amount of charge, the secondary battery 100 is charged and discharged. This makes it possible to achieve gradual decrease in SOC without making the SOC of the secondary battery 100 more than 75%. Subsequently, in step T9, it is decided whether or not the SOC of the secondary battery 100 reaches 50%. Note here that the SOC of the secondary battery 100 is, as described above, estimated every given time interval by the battery controller 30.

If in step T9, it is decided that the SOC has not yet reached 50% (No), the battery controller 30 continues to take control of the excessive discharging. On the other hand, if in step T9, it is decided that the SOC has reached 50% (Yes), then the procedure proceeds to step TA and the excessive discharging control is terminated to return to the normal charging and discharging control.

As described above, in Embodiment 1, the battery controller 30 takes control of the SOC of each of the secondary batteries 100 constituting the assembled battery 10 so that their SOC stays above 25% but below 75%. In this way, Embodiment 1 uses, as a control center, SOC 50% and the charging and discharging of the secondary battery 100 is controlled within the SOC range of from 25% to 75%.

As shown in FIG. 6, in the secondary battery 100, the variation in battery voltage associated with the variation in SOC (the amount of stored charge) is small in the SOC range of from 25% to 75%. More specifically, in this wide SOC range of from 25% to 75%, the battery voltage value varies from about 3.8 V only up to about 4.0 V. Therefore, the battery voltage value can be stably maintained high (around 3.9 V) over the SOC range of from 25% to 75%. Therefore, according to the hybrid electric vehicle 1 of Embodiment 1, it is possible to stably provide high output power from the secondary battery 100 and as a result, it becomes possible to achieve good travelling performance.

Incidentally, the secondary battery 100 has, as described above, the positive active material 153 formed of lithium manganate having a spinel crystal structure. The problem with conventional secondary batteries employing, as positive active material, lithium manganate having a spinel crystal structure is that $Mn^{2+}$ solved out from a positive electrode covers the surface of a negative electrode and extracts Li intercalated to the negative electrode, thereby resulting in degradation in performance of the battery.

In regard to this, the inventors of the present application have discovered that the solving-out of $Mn^{2+}$ is contributed to by the change in crystal structure associated with the variation in valence of Mn ($Mn^{3+} \rightarrow Mn^{4+}$) in the positive active material associated with charging and discharging. The inventors of the present application have further found out that the second peak B appearing on the V–dQ/dV curve is contributed to by the change in crystal structure of the positive active material (lithium manganate having a spinel crystal structure). From these findings, the inventors of the present application thought that if the battery voltage V of the secondary battery 100 reached and went beyond the battery voltage value V2 at the second peak B appearing on the V–dQ/dV curve, this could cause $Mn^{2+}$ to solve out from the positive electrode to result in degradation in battery performance.

Therefore, in the secondary battery system 6 of Embodiment 1, the battery controller 30 takes control of the charging and discharging of the second battery 100 so that the battery voltage V of the secondary battery 100 will not exceed the battery voltage value V2 at the second peak B appearing on the V–dQ/dV curve.

More specifically, as has been described with reference to FIG. 8, the battery controller 30 decides whether or not the secondary battery 100 reaches a state corresponding to the second peak B (see step T5). Then, if the decision is that the secondary battery 100 has reached the state corresponding to the second peak B (Yes), the charging of the secondary battery 100 is brought to a stop (see step T6). Thereafter, the assembled battery 10 (the secondary battery 100) starts to be controlled in regard to the excessive discharging thereof (see step T8). This makes it possible that the battery voltage V of the secondary battery 100 will gradually decrease from the battery voltage value V2 without exceeding the battery voltage value V2 at the second peak B. Because of this, it becomes possible to prevent the solving out of $Mn^{2+}$ from the positive electrode, thereby making it possible to preventing the battery from performance degradation due to the solving out of $Mn^{2+}$.

In Embodiment 1, furthermore, the battery controller 30 corresponds to dQ/dV calculation means, control means and judgment means.

Here, a description will be given regarding a method of manufacture of the secondary battery 100 of Embodiment 1.

In the first place, lithium manganate having a spinel crystal structure (the positive active material 153), acetylene black (conduction enhancement additive) and polyvinylidene fluoride (binder resin) were mixed at a mixing ratio of 87:10:3 (ratio by weight). This mixture was mixed with N-methylpyrrolidone (dispersion solvent), to thereby prepare a positive electrode slurry. Subsequently, this positive electrode slurry was applied to the surface of an aluminum foil 151 and dried and thereafter was subjected to press working. This produced the positive electrode plate 155 by coating the surface of the aluminum foil 151 with the positive material mixture 152 (see FIG. 5).

In addition, graphite (the negative active material 154), styrene-butadiene copolymer (binder resin) and carboxymethyl cellulose (thickening agent) were mixed in water at a mixing ratio of 98:1:1 (ratio by weight), to thereby prepare a negative electrode slurry. Subsequently, the negative electrode slurry was applied to the surface of a copper foil 158 and dried and thereafter was subjected to press working. This produced the negative electrode plate 156 by coating the surface of the copper foil 158 with the negative material mixture 159 (see FIG. 5). Note here that in Embodiment 1, the positive electrode slurry and the negative electrode slurry were adjusted in their application quantity so that the ratio of the theoretical capacity of the positive electrode and the theoretical capacity of the negative electrode was 1:1.5.

Next, the positive electrode plate 155, the negative electrode plate 156 and the separator 157 were layered one upon the other. This lamination was wound to form the electrode body 150 having an elongated oval shape in cross section (see FIGS. 4 and 5). However, at the time of laying the positive electrode plate 155, the negative electrode plate 156 and the separator 157 one upon the other, the positive electrode plate 155 should be placed such that a part of the positive electrode plate 155 not coated with the positive material mixture 152 projects from one end of the electrode body 150. Furthermore, the negative electrode plate 156 should be placed such that a part of the negative electrode plate 156 not coated with the negative material mixture 159 projects from the side opposite to the non-coated part of the positive electrode plate 155. Because of this, the electrode body 150 (see FIG. 3) having the positive electrode wound part 155b and the negative electrode wound part 156b is formed. In Embodiment 1 further employs, as the separator 157, a porous film formed of polyethylene.

Next, the positive electrode wound part 155b of the electrode body 150 and the positive terminal 120 are connected together through the positive current collector 122. Furthermore, the negative electrode wound part 156b of the electrode body 150 and the negative terminal 130 are connected together through the negative current collector 132. Thereafter, this was housed in the rectangular housing section 111. The rectangular housing section 111 and the cover section 112 are welded together, and the battery casing 110 is sealed off. Subsequently, an electrolytic solution is poured through a fill port (not shown) formed in the cover section 112. Thereafter, the fill port is closed to complete the secondary battery 100 of Embodiment 1. In addition, Embodiment 1 uses, as electrolytic solution, a solution prepared by dissolving, into a solution prepared by mixing EC (ethylene carbonate) and DEC (diethyl carbonate) at a mixture ratio of 4:6 (ratio by volume), lithium hexafluorophosphate ($LiPF_6$) at a ratio of 1 mol/L.

Embodiment 2

In Embodiment 2, cycle degradation testing was first conducted on the secondary battery 100.

Firstly, there were prepared four constant-temperature baths whose bath temperatures were 0° C., 25° C., 45° C., and 60° C., respectively. Successively, secondary batteries 100 were put one in each of the constant-temperature baths and cycle charging and discharging was performed on each secondary battery 100. More specifically, 500 cycles of charging and discharging at an electric current value of 2 C were carried out in which the charging upper limit voltage value=4.2 V and the discharging lower limit voltage value=3.0 V. In this way, cycle charging and discharging was carried out at four different ambient temperatures in order to expedite the secondary batteries 100 to undergo degradation.

Next, in regard to each of the secondary batteries 100 after the above-mentioned cycle degradation testing, their respective internal resistance (mΩ) was measured in the following way. First, in regard to each of the secondary batteries 100, discharging was carried out at an electric current value of ⅓ C until the battery voltage value had reached 3.0 V. Thereafter, charging was carried out at an electric current value of ⅕ C so that SOC=50%. In this condition, the internal resistance of each of the secondary batteries 100 was measured by an alternating-current impedance method. More specifically, a Model 1252A manufactured by Solartron was used as an FRA (Frequency Response Analyzer) and a Model SI1287 (Solartron) was used as a control unit, and while applying an electric potential amplitude of 5 mV, the frequency was varied from 1 MHz to 1 Hz. The value, measured at the time when the frequency was at 1 kHz, was used to serve as the internal resistance value (mΩ) of each of the secondary batteries 100. As a result, all of the secondary batteries 100 on which the cycle degradation testing was conducted were found to have increased in their internal resistance, when compared to the secondary batteries 100 in their initial state (i.e., the secondary batteries 100 on which the cycle degradation testing was not yet performed (see FIG. 13).

Figure 10:
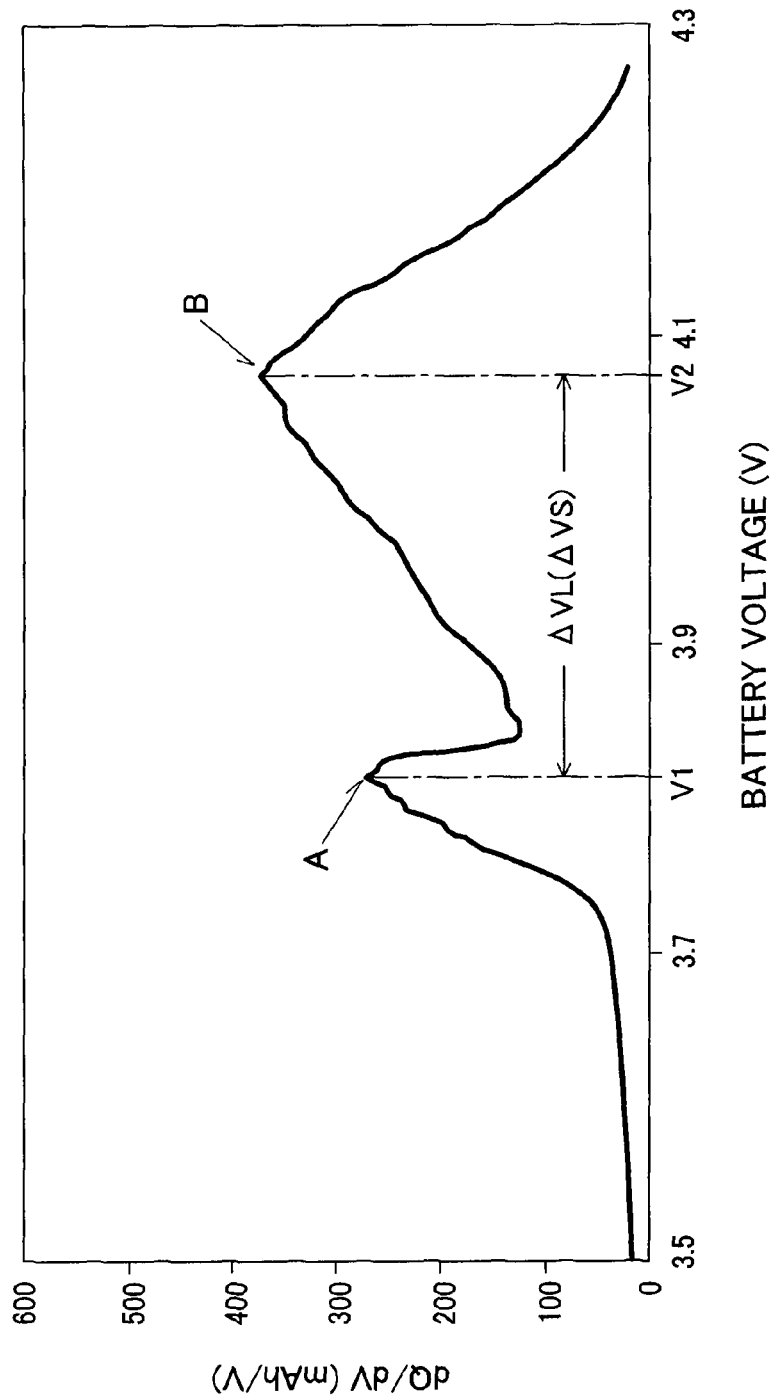
FIG. 10 is a chart representing a V–dQ/dV curve for the secondary battery whose internal resistance has increased.

With respect to each secondary battery 100 on which the cycle degradation testing was conducted, there was acquired a respective V−dQ/dV curve representative of a relationship between the battery voltage V value and the dQ/dV value. More specifically, with respect to each secondary battery 100, its storage amount Q and its battery voltage V were acquired for every predetermined time interval T (for example, every one second) in the SOC range of from 0% (battery voltage=3.0 V) to 100% (battery voltage=4.2 V). Based on the acquired storage amount Q and the acquired battery voltage V, the dQ/dV value (i.e., the ratio of dQ (the variation in storage amount Q) to dV (the variation in battery voltage V) was calculated for every predetermined time interval, to thereby represent a relationship between the dQ/dV value and the battery voltage V in the form of a V−dQ/dV curve. Referring to FIG. 10, there is shown one of the V−dQ/dV curves (i.e., a V−dQ/dV curve acquired for the secondary battery 100 which was placed in a constant temperature bath of a bath temperature of 60° C. and on which the cycle degradation testing was run).

On the other hand, a secondary battery 100 in its initial state was placed in a connection defect condition and its V−dQ/dV curve was acquired in the above-described way.

Figure 12:
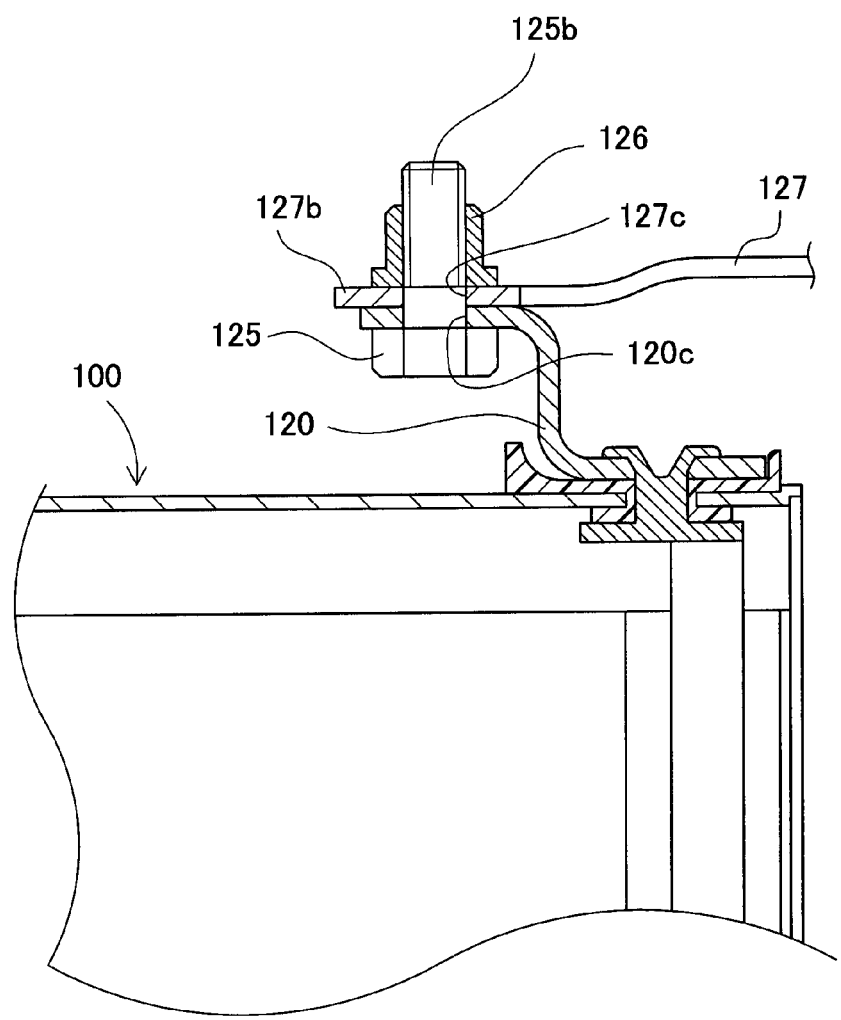
FIG. 12 is a diagram for explanation of the connection of a positive terminal of the secondary battery with a cable.

A cable 127 for connection of the battery controller 130 and others and the positive terminal 120 of the secondary battery 100 is connected as follows. As shown in FIG. 12, with a screw part 125b of a bolt 125 inserted through a through hole 120c of the positive terminal 120 and then through a through hole 127c of a connection terminal 127b, a nut 126 is threadably fit into the screw part 125b of the bolt 125, to thereby fasten together the positive terminal 120 and the connection terminal 127b. This makes it possible that the positive terminal 120 and the connection terminal 127b closely contact with each other and that both these terminals are properly connected together. Accordingly, here, the nut 126 was loosened to create a condition that caused the positive terminal 120 and the connection terminal 127b to be not in close contact with each other, that is, the secondary battery 100 was placed in a connection defect condition.

Here, the V−dQ/dV curve of the initial-state secondary battery 100 (see FIG. 9) is compared with the V−dQ/dV curve of the secondary battery 100 of increased internal resistance due to the cycle degradation testing (see FIG. 10). In each of these two V−dQ/dV curves, there appear two definite curves (the first curve A and the second curve B).

First, referring to FIG. 9, the difference value ΔVK (=V2−V1) between the battery voltage value V1 at the first peak A and the battery voltage value V2 at the second peak B is calculated. In addition, referring to FIG. 10, the difference value ΔVL (=V2−V1) between the battery voltage value V1 at the first peak A and the battery voltage value V2 at the second peak B is calculated.

The comparison between ΔVK and ΔVL shows that ΔVL>ΔVK. Stated in another way, this proves that the secondary battery 100 of increased internal resistance is larger, in difference value ΔV between the battery voltage value V1 at the first peak A and the battery voltage value V2 at the second peak B, than the initial-state secondary battery 100.

Figure 13:
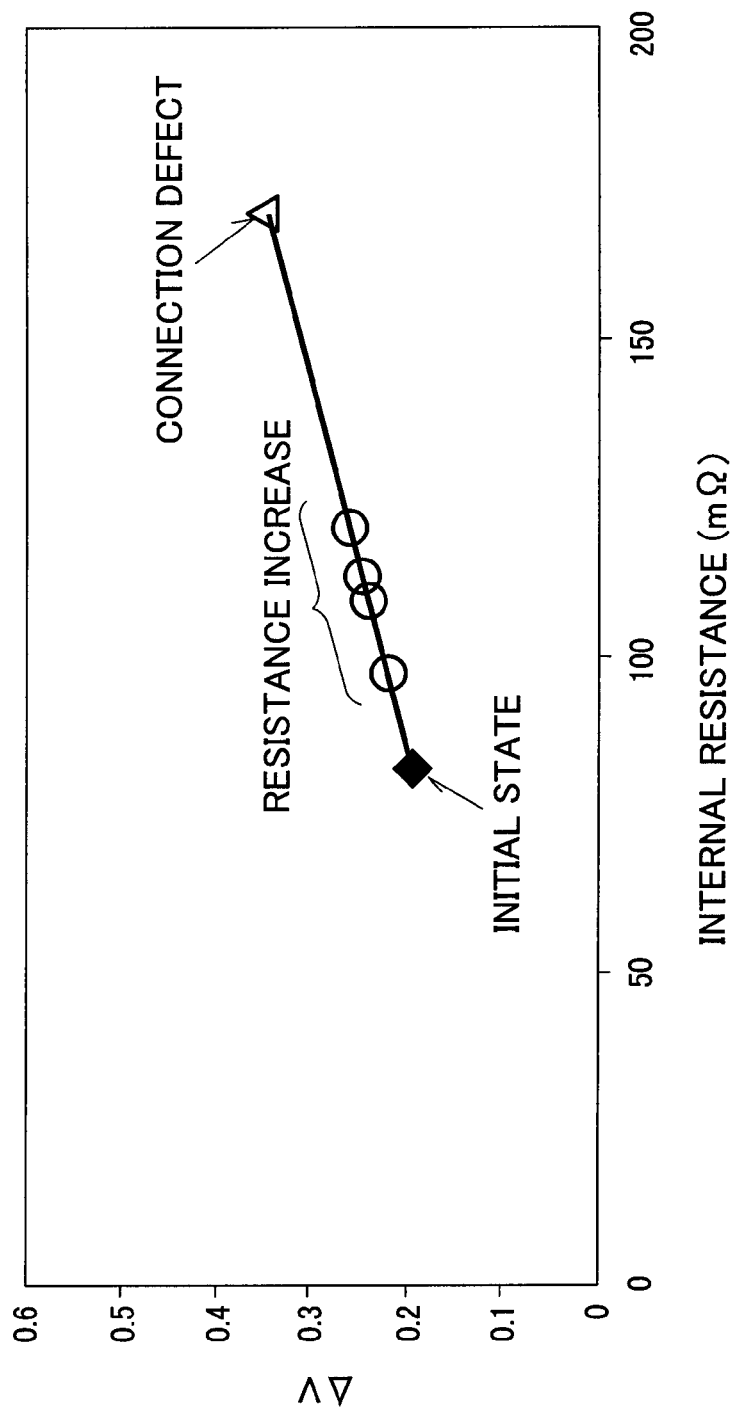
FIG. 13 is a graph representing an internal resistance (mΩ) versus ΔV (=V2−V1) relationship for the secondary battery.

In the way as described above, with respect to each secondary battery 100 of increased internal resistance due to the cycle degradation testing and with respect to the secondary battery 100 whose connection was rendered faulty, the difference value ΔV between the battery voltage value V1 at the first peak A and the battery voltage value V2 at the second peak B was calculated. The result is shown in FIG. 13 in the form of a graph representative of a relationship between the internal resistance (mΩ) and the difference value ΔV. In FIG. 13, the black rhombus-shaped symbol indicates the secondary battery 100 in an initial state, the white circle-shaped symbol indicates the secondary battery 100 of increased internal resistance (i.e., the secondary battery 100 on which the cycle degradation testing was conducted) and the white triangle-shaped symbol indicates the secondary battery 100 with occurrence of a connection defect.

FIG. 13 shows that as the internal resistance of the secondary battery 100 increases, the difference value ΔV between the battery voltage value V1 at the first peak A and the battery voltage value V2 at the second peak B likewise increases. In addition, for the case of the secondary battery 100 with a connection defect, the difference value ΔV becomes extremely large (about 1.9 times relative to the secondary battery 100 in an initial state).

In Embodiment 2, this characteristic feature is used to detect an increase in internal resistance of the secondary battery 100 and a connection defect occurring in the secondary battery 100.

In comparison with the hybrid electric vehicle 1 of Embodiment 1, a hybrid electric vehicle 201 of Embodiment 2 differs only with regard to its secondary battery system (see FIG. 1). In comparison with the secondary battery system 6 of Embodiment 1, the secondary battery system of Embodiment 2 differs only with regard to its battery controller, and the rest remain the same. Accordingly, here, the following explanation will be given focusing on points different from Embodiment 1, and with respect to the similar points to Embodiment 1, their explanation will be either omitted or be given in a simplified way.

Figure 11:
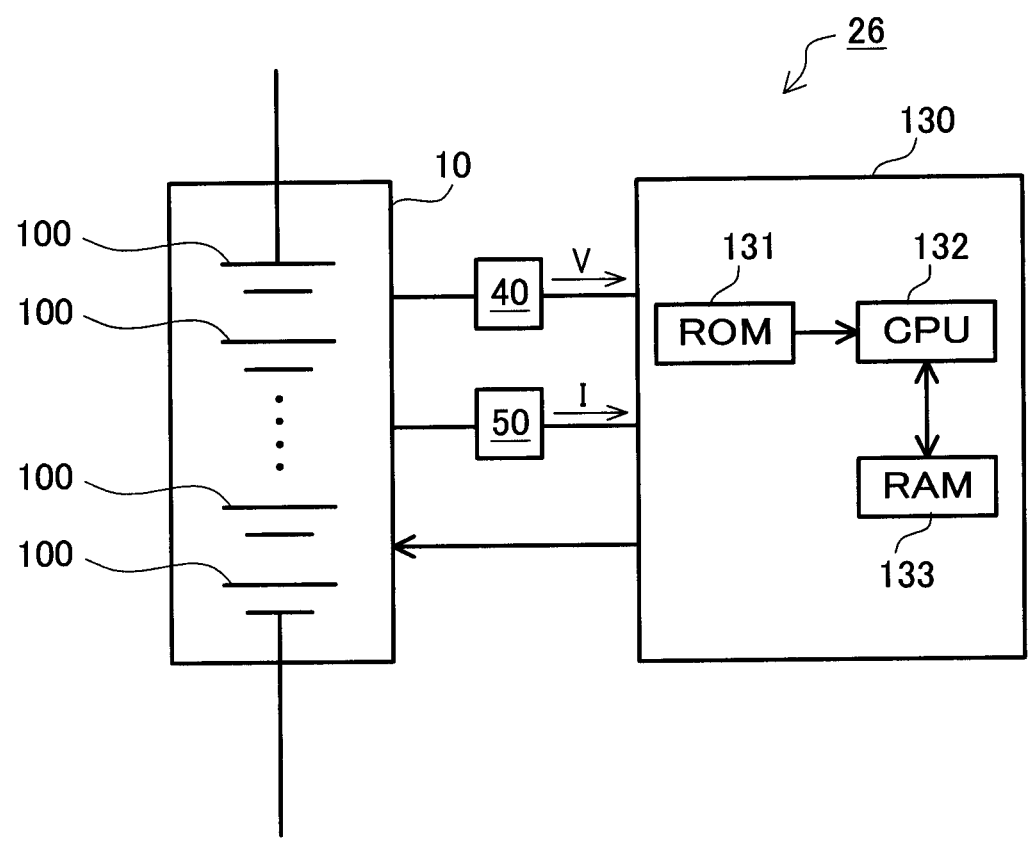
FIG. 11 is a schematic diagram of a secondary battery system in Embodiment 2.

Referring to FIG. 11, the secondary battery system 26 of Embodiment 2 is provided with an assembled battery 10, voltage detection means 40, electric current detection means 50 and a battery controller 130. The battery controller 130 has a ROM 131, a CPU 132, a RAM 133, etc.

Like the battery controller 30 of Embodiment 1, the ROM 131 of the battery controller 130 prestores a V–dQ/dV curve K (see FIG. 9) which represents a battery voltage V versus dQ/dV relationship acquired in regard to the initial-state secondary battery 100. The ROM 131 further stores a reference voltage difference value ΔVK (=V2−V1=0.2 V) as a difference value between the battery voltage value V1 at the first peak A on the V–dQ/dV curve K and the battery voltage value V2 at the second peak B on the V–dQ/dV curve K.

Furthermore, based on the dQ/dV value calculated every given time interval T, the battery controller 130 draws_in real time a V–dQ/dV curve. And by comparison (by pattern matching) between this drawn V–dQ/dV curve and the V–dQ/dV curve K (see FIG. 9) stored in the ROM 131, the battery controller 130 decides whether or not the secondary battery 100 reaches a state corresponding to the first peak A on the V–dQ/dV curve K or whether or not the secondary battery 100 reaches a state corresponding to the second peak B on the V–dQ/dV curve K. In other words, the battery controller 130 decides whether or not the battery voltage V value detected every given time interval T and the dQ/dV value calculated every given time interval T become values indicative of either the first peak A or the second peak B on the V–dQ/dV curve.

For example, in the case where the battery controller 130 decides that the secondary battery 100 has reached the state corresponding to the first peak A, the battery voltage value V1 of the secondary battery 100 then detected by the voltage detection means 40 (i.e., the battery voltage value V1 of the secondary battery 100 detected by the voltage detection means 40 at the point of time when the secondary battery 100 is estimated, by the judgmental decision of the battery controller 130, to have reached the state corresponding to the first peak A) is stored. In the case where the battery controller 130 decides that the secondary battery 100 has reached the state corresponding to the second peak B, the battery voltage value V2 of the secondary battery 100 then detected by the voltage detection means 40 (i.e., the battery voltage value V2 of the secondary battery 100 detected by the voltage detection means 40 at the point of time when the secondary battery 100 is estimated, by the judgment decision of the battery controller 130, to have reached the state corresponding to the second peak B) is stored. And there is calculated a measured voltage difference value ΔVS (=V2−V1) as a difference value found by subtraction of the battery voltage value V1 from the battery voltage value V2.

Furthermore, the battery controller 130 makes a comparison between the reference voltage difference value ΔVK and the measured voltage difference value ΔVS. If the measured voltage difference value ΔVS is larger than the reference voltage difference value ΔVK, the decision is that there is an increase in internal resistance of the secondary battery 100. Especially, if the measured voltage difference value ΔVS is larger than 1.8 times the reference voltage difference value ΔVK, the decision is that a connection defect occurs in the secondary battery 100. In this case, the battery controller 130 outputs a signal representing that a connection defect occurs in the secondary battery 100, to thereby prompt confirmation of the connection of the secondary battery 100.

In addition, like the secondary battery system 6 of Embodiment 1, also in the secondary battery system 26 of Embodiment 2, the battery controller 130 takes control of the SOC of the secondary battery 100. In particular, the SOC of the secondary batteries 100 constituting the assembled battery 10 is controlled to be not less than 25% nor more than 75% (see FIGS. 7 and 8). In this way, the charging and discharging of the secondary battery 100 is controlled within the SOC range of from 25% to 75%, taking SOC 50% as the center of control.

Next, referring to FIGS. 14 and 15, a detailed description will be given regarding a method of detecting an increase in internal resistance of the secondary battery 100 of Embodiment 2 and in addition, a detailed description will be given regarding a method of detecting a connection defect in the secondary battery 100 of Embodiment 2.

Figure 14:
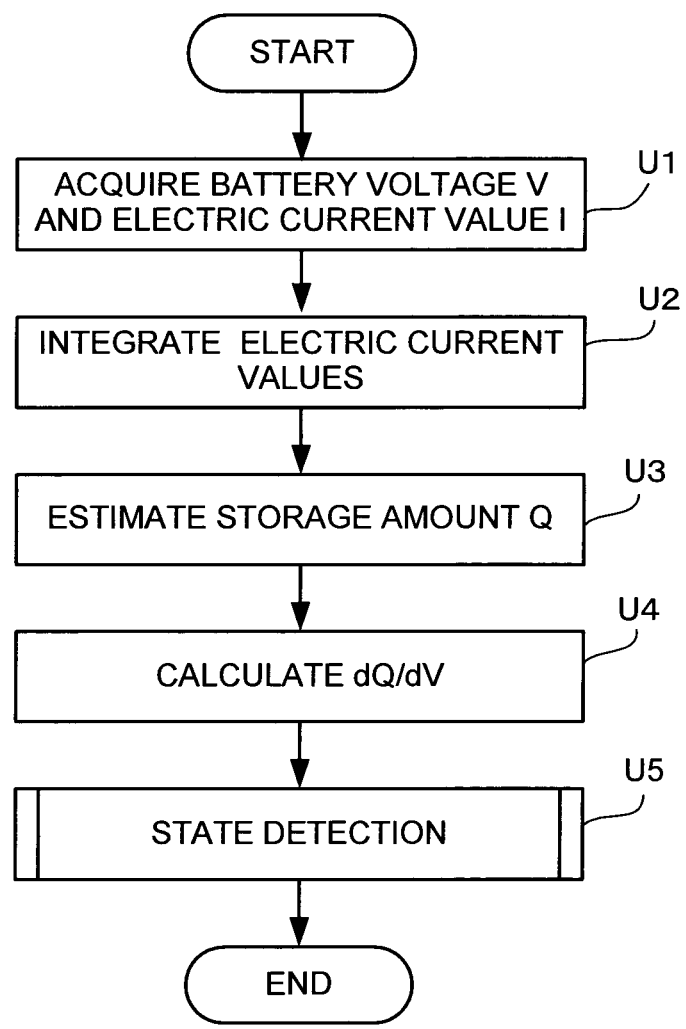
FIG. 14 is a main routine of state detection of the secondary battery in Embodiment 2.

Firstly, upon startup of the controlling of the charging and discharging of the assembled battery 10 (the secondary battery 100), the battery controller 130 acquires a value for the battery voltage V of each secondary battery 100 detected by the voltage detection means 40 and a value for the electric current I (a value for electric current flowing through the secondary battery 100) detected by the electric current detection means 50 (step U1 shown in FIG. 14). In Embodiment 2, further, the battery controller 130 acquires a value for the battery voltage V and a value for the electric current I every given time interval T (for example, every one second).

Next, the procedure proceeds to step U2 in which the battery controller 130 integrates a value for the electric current I detected by the electric current detection means 50, to thereby calculate an amount of charge of each secondary battery 100. Subsequently, the procedure proceeds to step U3 in which based on the calculated amount of charge, the battery controller 130 estimates an amount of electricity stored in each secondary battery 100 (the storage amount Q). Additionally, in Embodiment 2, the storage amount Q with respect to every given time interval T is estimated based on the electric current I value detected every given time interval T (for example, every one second).

Next, the procedure proceeds to step U4 in which the dQ/dV value (i.e., the ratio of dQ to dV where dQ is the variation in storage amount Q and dV is the variation in battery voltage V) is calculated for each secondary battery 100. Stated in another way, the storage amount Q of the secondary battery 100 is differentiated with respect to the corresponding battery voltage V value, to thereby calculate the dQ/dV value. In particular, for each secondary battery 100, the variation dV in battery voltage V and the variation dQ in storage amount Q with respect to every given time interval T are calculated based on the battery voltage V value and the storage amount Q acquired every given time interval T. And based on these calculations, the dQ/dV value with respect to every given time interval T is calculated.

Next, the procedure proceeds to step U5 in which the state of each secondary battery 100 is detected. In detail, the procedure proceeds to a subroutine shown in FIG. 15. Firstly, in step U51, it is decided whether or not each secondary battery 100 reaches a state corresponding to the first peak A on the V–dQ/dV curve. In particular, based on the dQ/dV value calculated every given time interval T, the battery controller 130 draws in real time a V–dQ/dV curve. And by comparison (by pattern matching) between this drawn V–dQ/dV curve and the V–dQ/dV curve K (see FIG. 9) stored in the ROM 131, the battery controller 130 decides whether or not the secondary battery 100 reaches a state corresponding to the first peak A on the V–dQ/dV curve K.

If the decision is that the secondary battery 100 has not yet reached the state corresponding to the first peak A (No), then the procedure returns back to the main routine shown in FIG. 14, and the processes of Steps U1-U4 are executed over again.

On the other hand, if the decision is that the secondary battery 100 has reached the state corresponding to the first peak A (Yes), then the procedure proceeds to step U52 in which the battery voltage value V1 of each secondary battery 100, detected by the voltage detection means 40 at the time when the state corresponding to the first peak A has been reached, is stored. In addition, after the decision that the secondary battery 100 has reached the state corresponding to the first peak A (Yes) is made, the battery controller 130 provides control of the excessive charging until the secondary battery 100 reaches SOC 50% (see FIG. 7).

Next, the procedure proceeds to step U53 in which it is decided whether or not each secondary battery 100 has reached the state corresponding to the second peak B on the V–dQ/dV curve. More specifically, based on the dQ/dV value calculated every given time interval T, the battery controller 130 draws in real time a V–dQ/dV curve. And by comparison (by pattern matching) between this drawn V–dQ/dV curve and the V–dQ/dV curve K stored in the ROM 131, the battery controller 130 decides whether or not the secondary battery 100 has reached the state corresponding to the second peak B on the V–dQ/dV curve.

If the decision is that the secondary battery 100 has not yet reached the state corresponding to the second peak B (No), then the procedure returns back to the main routine shown in FIG. 14, and the processes of Steps U1-U4 are executed over again.

On the other hand, if the decision is that the secondary battery 100 has reached the state corresponding to the second peak B (Yes), then the procedure proceeds to step U54 in which the battery voltage value V2 of each secondary battery 100, detected by the voltage detection means 40 at the time when the state corresponding to the second peak B has been reached, is stored. In addition, after it is decided that the secondary battery 100 has reached the state corresponding to the second peak B (Yes), the battery controller 130 provides control of the excessive discharging until the secondary battery 100 reaches SOC 50% (see FIG. 8).

Next, the procedure proceeds to step U55 in which to calculate a measured voltage difference value $\Delta VS$ (=V2−V1) which is a difference value found by subtraction of the battery voltage value V1 from the battery voltage value V2.

Thereafter, the procedure proceeds to step U56 in which there is made a comparison between the measured voltage difference value $\Delta VS$ calculated and the reference voltage difference value $\Delta VK$ stored in the ROM 131. In particular, the measured voltage difference value $\Delta VS$ is divided by the reference voltage difference value $\Delta VK$, to thereby calculate a value for $\Delta VS/\Delta VK$.

Next, the procedure proceeds to step U57 in which a decision is made on whether or not the condition of $\Delta VS/\Delta VK>1$ is met. That is, it is decided whether or not the measured voltage difference value $\Delta VS$ is larger than the reference voltage difference value $\Delta VK$. If the decision is that $\Delta VS/\Delta VK>1$ is not met (No), then the procedure returns back to the main routine shown in FIG. 14 and the series of processes is brought to a stop.

On the other hand, if the decision is that the condition of $\Delta VS/\Delta VK>1$ is met (Yes), then the procedure proceeds to step U58 in which a decision is made on whether or not the condition of $\Delta VS/\Delta VK>1.8$ is met. That is, it is decided whether or not the measured voltage difference value $\Delta VS$ exceeds 1.8 times the reference voltage difference value $\Delta VK$.

If the decision in step U58 is that $\Delta VS/\Delta VK>1.8$ is not met (No), then the procedure proceeds to step U59 in which it is decided that there is an increase in internal resistance of the secondary battery 100. On the other hand, if the decision is that the condition of $\Delta VS/\Delta VK>1.8$ is met (Yes), then the procedure proceeds to step U5A in which it is decided that a connection defect occurs in the secondary battery 100. In this case, the procedure proceeds to step U5B to output a signal representing that a connection defect occurs in the secondary battery 100, thereby prompting confirmation of the connection of the secondary battery 100.

In the way as described above, in Embodiment 2, the state of the secondary battery system 26 (in particular, the increase in internal resistance and the occurrence of a connection defect in the secondary battery 100) is detected based on the definite peaks (the first peak A and the second peak B) appearing on the V–dQ/dV curve. Therefore, in Embodiment 2, it becomes possible to accurately detect an increase in internal resistance of the secondary battery 100 and a connection defect in the secondary battery 100 in spite of the use of the secondary battery 100 within the range in which the variation in battery voltage associated with the variation in SOC (the amount of stored charge) is small (in particular, within the SOC range of from 25% to 75%).

In Embodiment 2, further, the battery controller 130 corresponds to dQ/dV calculation means, control means, judgment means, resistance increase detection means and connection defect detection means.

Embodiment 3

In regard to the four secondary batteries 100 on which the cycle degradation testing was conducted in Embodiment 2, their respective battery capacity (capacity when fully charged) was measured in the following way. In the first place, in regard to each secondary battery 100, charging was carried out at an electric current value of 1/5 C to such an extent that the battery voltage reached 4.2 V (SOC 100%). Thereafter, charging was carried out at a constant voltage of 4.2 V and was brought to a stop when the electric current value dropped to 1/10 of the initial electric current value. Subsequently, in regard to each secondary battery 100, discharging was carried out at an electric current value of 1/5 C to such an extent that the battery voltage reached 3.0 V (SOC 0%). The discharging capacity at this time was measured as the battery capacity of each secondary battery 100 (capacity when fully charged).

In addition, in regard to the secondary battery 100 whose battery voltage reached 3.0 V (SOC 0%), charging was carried out at an electric current value of 1/5 C. During the charging, a V–dQ/dV curve was drawn in real time. This curve was displayed on the monitor. The V–dQ/dV curve drawn on the monitor was observed with eyes and when it was decided that the first peak A was reached (the secondary battery 100 reached a state corresponding to the first peak A), the charging was brought into a stop. Thereafter, in regard to the secondary battery 100, constant current discharging was carried out at an electric current value of 1/5 C to such an extent that the battery voltage reached 3.0 V (SOC 0%). The discharging capacity at this time was acquired as a storage amount Q1 at the time when the secondary battery 100 reached the state corresponding to the first peak A.

Further, in regard to the secondary battery 100 whose battery voltage reached 3.0 V (SOC 0%), charging was carried out at an electric current value of 1/5 C. During the charging, there was drawn in real time a V–dQ/dV curve. This curve was displayed on the monitor. The V–dQ/dV curve drawn on the monitor was observed with eyes and when it was decided that the second peak B was reached (the secondary battery 100 reached a state corresponding to the second peak B), the charging was brought into a stop. Thereafter, in regard to the secondary battery 100, constant current discharging was carried out at an electric current value of 1/5 C to such an extent that the battery voltage reached 3.0 V (SOC 0%). The discharging capacity at this time was acquired as a storage amount Q2 at the time when the secondary battery 100 reached the state corresponding to the second peak B. Furthermore, there is calculated a difference value $\Delta Q$ (=Q2−Q1) between the storage amount Q1 and the storage amount Q2.

In addition, in regard to the initial-state secondary battery 100 without the cycle degradation testing, its battery capacity, storage amount Q1, storage amount Q2 and difference value $\Delta Q$ (which is taken as a reference voltage difference value $\Delta QK$) were acquired in the way as described above.

Additionally, there was prepared a secondary battery 100 in an internal micro short-circuiting condition. And in regard to this secondary battery 100, its battery capacity, storage amount Q1, storage amount Q2 and difference value $\Delta Q$ were acquired in the way as described above.

Figure 17:
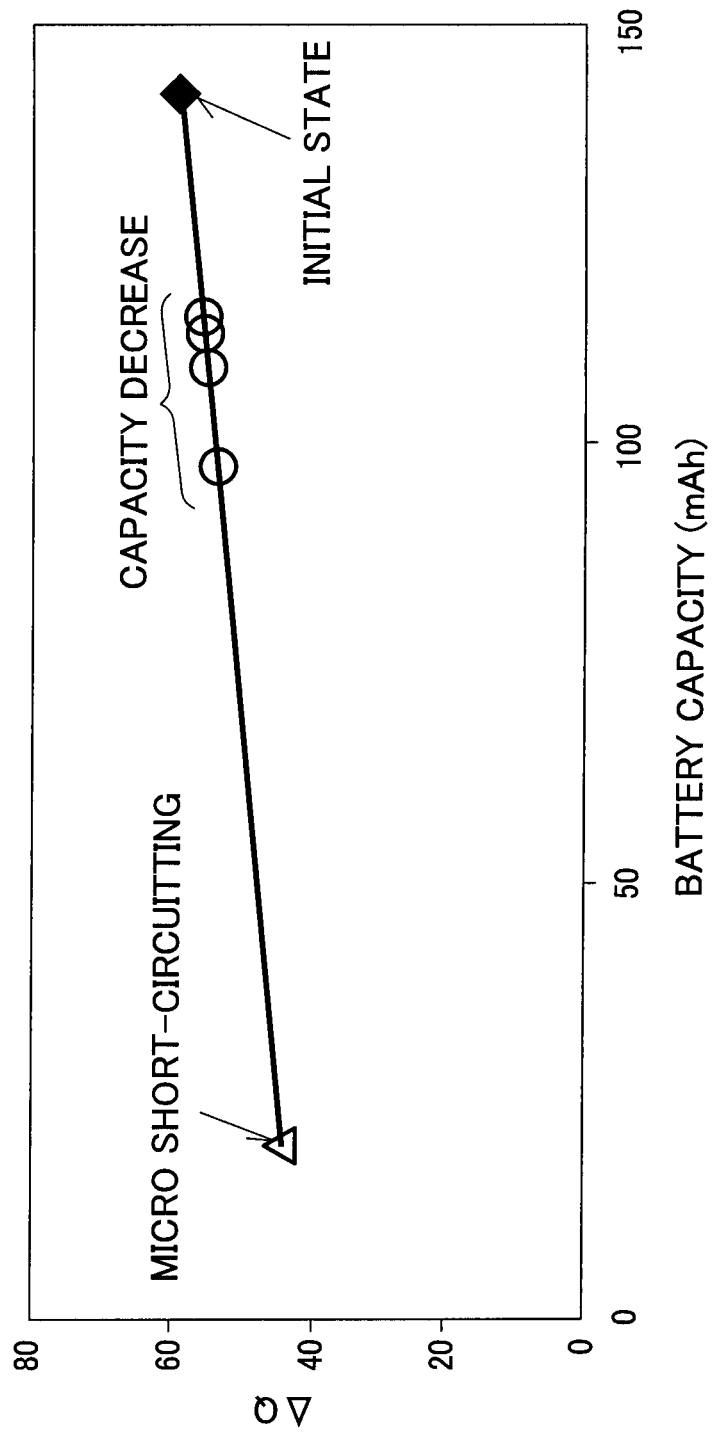
FIG. 17 is a graph representing a battery capacity versus ΔQ (=Q2−Q1) relationship for the secondary battery.

The result is shown in FIG. 17 in the form of a graph representative of a relationship between the battery capacity (mAh) and $\Delta Q$. In FIG. 17, the black rhombus-shaped symbol indicates the secondary battery 100 in an initial state, the white circle-shaped symbol indicates the secondary batteries 100 of decreased capacity (i.e., the four secondary batteries 100 on which the cycle degradation testing was conducted) and the white triangle-shaped symbol indicates the secondary battery 100 placed in an internal micro short-circuiting condition. Note that the battery capacity of each of the four secondary batteries 100 on which the cycle degradation testing was conducted became lessened in battery capacity as compared to the initial state secondary battery 100 (the secondary battery 100 without the cycle degradation testing).

FIG. 17 shows that as the battery capacity (capacity when fully charged) decreases, the difference value $\Delta Q$ (=Q2−Q1) between the storage amount Q1 at the first peak A and the storage amount Q2 at the second peak B diminishes. It is further proved that in the secondary battery 100 placed in an internal micro short-circuiting condition, the difference value $\Delta Q$ decreases considerably (about 74% of that of the initial-state secondary battery 100), as compared to the initial-state secondary battery 100.

This above-described characteristic feature is utilized in Embodiment 3, and based on the difference value $\Delta Q$ (=Q2−Q1) between the storage amount Q1 and the storage amount Q2, there are detected a decrease in battery capacity and internal micro short-circuiting of the secondary battery 100.

In comparison with the hybrid electric vehicle 1 of Embodiment 1, a hybrid electric vehicle 301 of Embodiment 3 differs only with regard to its secondary battery system (see FIG. 1). In comparison with the secondary battery system 6 of Embodiment 1, the secondary battery system of Embodiment 3 differs only with regard to its battery controller, and the rest remain the same. Accordingly, here, a description will be given focusing on points different from Embodiment 1 and with respect to the similar points to Embodiment 1, their description will be either omitted or given in a simplified way.

Figure 16:
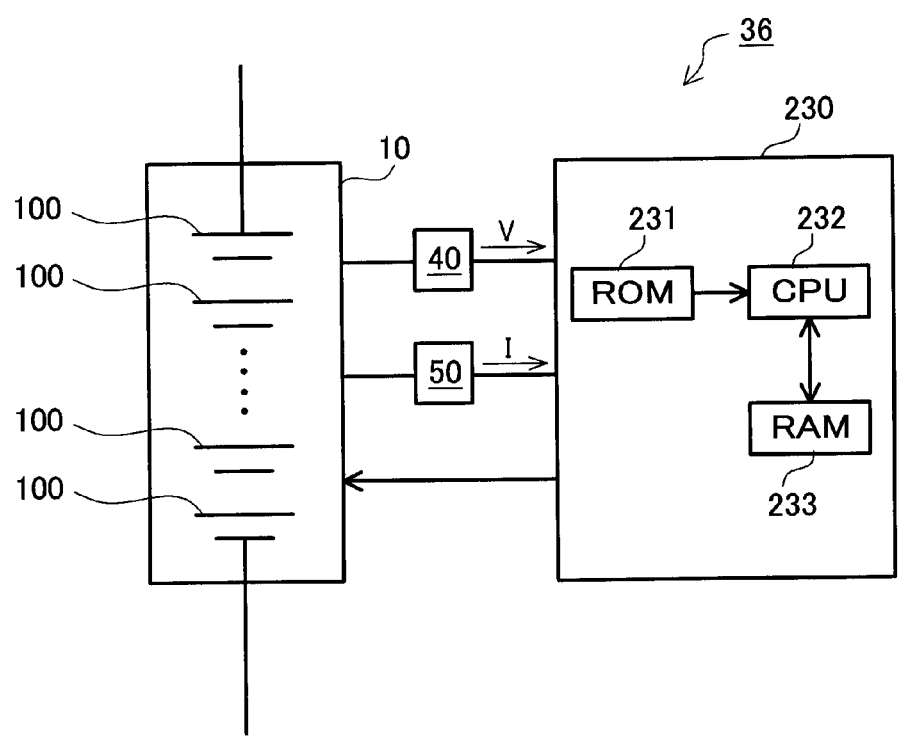
FIG. 16 is a schematic diagram of a secondary battery system in Embodiment 3.

Referring to FIG. 16, the secondary battery system 36 of Embodiment 3 is provided with an assembled battery 10, voltage detection means 40, electric current detection means 50 and a battery controller 230. The battery controller 230 has a ROM 231, a CPU 232, a RAM 233, etc.

Like the battery controller 30 of Embodiment 1, the battery controller 230 estimates the storage amount Q of each secondary battery 100 every given time interval T. Further, the battery controller 230 acquires the battery voltage V of each secondary battery 100 detected every given time interval T by the voltage detection means 40. Furthermore, the battery controller 230 calculates a value for dQ/dV every given time interval T.

In addition, like the battery controller 30 of Embodiment 1, the ROM 231 of the battery controller 230 prestores a V–dQ/dV curve K (see FIG. 9) which represents a battery voltage V versus dQ/dV relationship acquired in regard to the initial-state secondary battery 100. Further, the ROM 231 of the battery controller 230 stores the reference voltage difference value $\Delta QK$ (=Q2−Q1) as a difference value between the storage amount Q1 and the storage amount Q2 for the initial-state secondary battery 100.

Furthermore, based on the dQ/dV value calculated every given time interval T, the battery controller 230 draws in real time a V–dQ/dV curve. And by comparison (by pattern matching) between this drawn V–dQ/dV curve and the V–dQ/dV curve K (see FIG. 9) stored in the ROM 231, the battery controller 230 decides whether or not the secondary battery 100 reaches a state corresponding to the first peak A on the V–dQ/dV curve K or whether or not the secondary battery 100 reaches a state corresponding to the second peak B on the V–dQ/dV curve K. In other words, the battery controller 230 decides whether or not the battery voltage V value detected every given time interval T and the dQ/dV value calculated every given time interval T become values indicative of either the first peak A or the second peak B on the V–dQ/dV curve.

For example, if the battery controller 230 decides that the secondary battery 100 had reached the state corresponding to the first peak A, the storage amount Q1 of the secondary battery 100 then estimated (i.e., the storage amount Q1 of the secondary battery 100 estimated by the battery controller 230 at the point of time when the secondary battery 100 is estimated, by the judgmental decision of the battery controller 230, to have reached the state corresponding to the first peak A) is stored. In addition, if the battery controller 230 decides that the secondary battery 100 has reached the state corresponding to the second peak B, the storage amount Q2 of the secondary battery 100 then detected (i.e., the storage amount Q2 of the secondary battery 100 detected by the battery controller 230 at the point of time when the secondary battery 100 is estimated, by the judgment decision of the battery controller 230, to have reached the state corresponding to the second peak B) is stored. And there is calculated a measured voltage difference value ΔQS (=Q2−Q1) as a difference value found by subtraction of the storage amount Q1 from the storage amount Q2.

Furthermore, the battery controller 230 makes a comparison between the measured storage amount difference value ΔQS and the reference storage amount difference value ΔQK. If the measured storage amount difference value ΔQS is smaller than the reference storage amount difference value ΔQK, then the decision is that there is a decrease in battery capacity of the secondary battery 100. Especially, if the measured storage amount difference value ΔQS falls below 75% of the reference storage amount difference value ΔQK, then the decision is that there is an internal micro short-circuit in the secondary battery 100. In this case, the battery controller 230 outputs a signal representing that the secondary battery 100 is malfunctioning, to thereby prompt replacement of the secondary battery 100.

In addition, like the secondary battery system 6 of Embodiment 1, also in the secondary battery system 36 of Embodiment 3, the battery controller 230 takes control of the SOC of the secondary batteries 100. In particular, the SOC of the secondary batteries 100 constituting the assembled battery 10 is controlled to be not less than 25% nor more than 75% (see FIGS. 7 and 8). In this way, the charging and discharging of the secondary battery 100 is controlled within the SOC range of from 25% to 75%, taking SOC 50% as the center of control.

Next, referring to FIGS. 18 and 19, a detailed description will be given regarding a method of detecting a decrease in battery capacity of the secondary battery 100 of Embodiment 2 and in addition, a detailed description will be given regarding a method of detecting an internal micro short-circuit in the secondary battery 100 of Embodiment 2.

Figure 18:
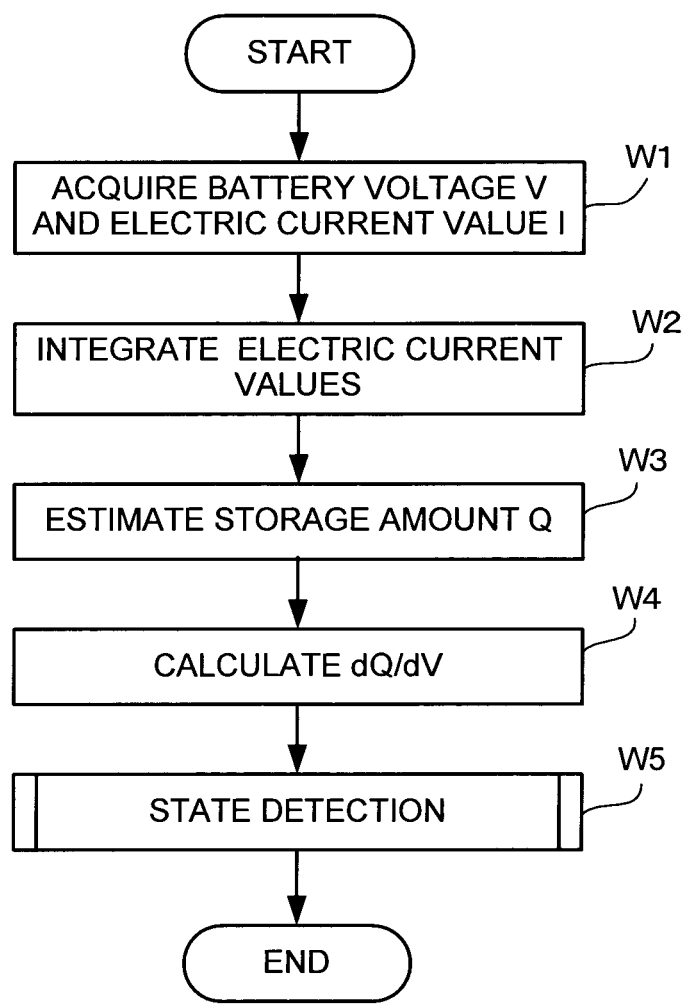
FIG. 18 is a main routine of state detection of the secondary battery in Embodiment 3.
Figure 19:
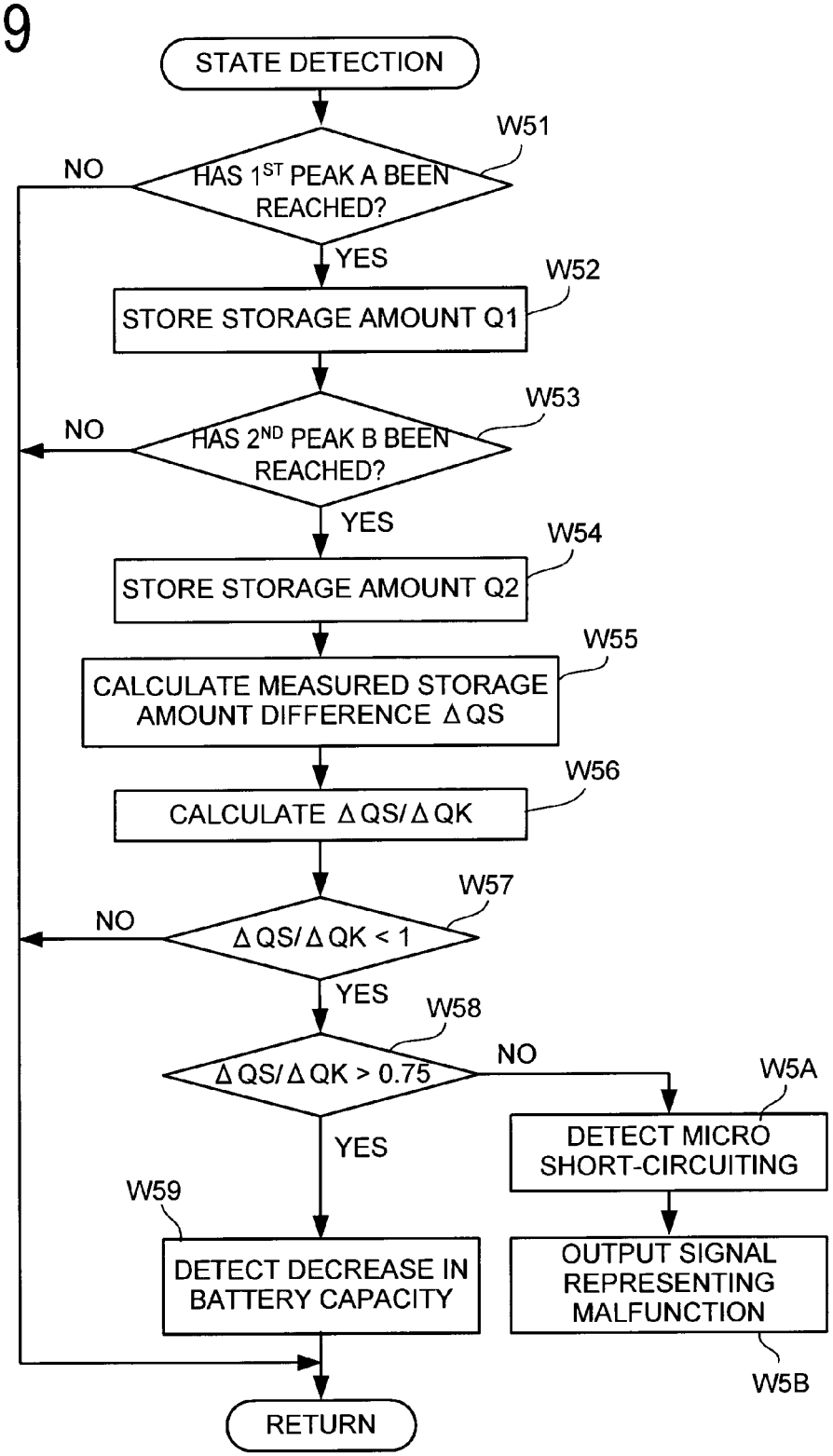
FIG. 19 is a sub-routine of the state detection of the secondary battery in Embodiment 3.

Firstly, upon startup of the controlling of the charging and discharging of the assembled battery 10 (the secondary battery 100), the battery controller 230 acquires a value for the battery voltage V of each secondary battery 100 detected by the voltage detection means 40 and a value for the electric current I (a value for electric current flowing through the secondary battery 100) detected by the electric current detection means 50 (step W1 shown in FIG. 18). In Embodiment 3, further, the battery controller 230 acquires a value for the battery voltage V and a value for the electric current I every given time interval T (for example, every one second).

Next, the procedure proceeds to step W2 in which the battery controller 230 integrates a value for the electric current I detected by the electric current detection means 50, to thereby calculate an amount of charge of each secondary battery 100. Subsequently, the procedure proceeds to step W3 in which based on the calculated amount of charge, the battery controller 230 estimates an amount of electricity stored in each secondary battery 100 (the storage amount Q). Additionally, in Embodiment 3, the storage amount Q with respect to every given time interval T is estimated based on the electric current I value detected every given time interval T (for example, every one second).

Next, the procedure proceeds to step W4 in which the value for dQ/dV (i.e., the ratio of dQ to dV where dQ is the variation in storage amount Q and dV is the variation in battery voltage V) is calculated for each secondary battery 100. Stated in another way, the storage amount Q of the secondary battery 100 is differentiated with respect to the corresponding battery voltage V value, to thereby calculate a value for dQ/dV. In particular, for each secondary battery 100, the variation dV in battery voltage V and the variation dQ in storage amount Q with respect to every given time interval T are calculated based on the battery voltage V value and the storage amount Q acquired every given time interval T. And based on these calculations, the dQ/dV value with respect to every given time interval T is calculated.

Next, the procedure proceeds to step W5 in which the state of each secondary battery 100 is detected. In detail, the procedure proceeds to a subroutine shown in FIG. 19. Firstly, in step W51, it is decided whether or not each secondary battery 100 reaches a state corresponding to the first peak A on the V–dQ/dV curve. In particular, based on the dQ/dV value calculated every given time interval T, the battery controller 230 draws in real time a V–dQ/dV curve. And by comparison (by pattern matching) between this drawn V–dQ/dV curve and the V–dQ/dV curve K (see FIG. 9) stored in the ROM 231, the battery controller 230 decides whether or not the secondary battery 100 reaches the state corresponding to the first peak A on the V–dQ/dV curve K.

If the decision is that the state corresponding to the first peak A (No) has not yet been reached, then the procedure returns back to the main routine shown in FIG. 18, and the processes of Steps W1-W4 are executed over again.

On the other hand, if the decision is that the state corresponding to the first peak A has been reached (Yes), then the procedure proceeds to step W52 in which the storage amount Q1 of each secondary battery 100, estimated at the time when the state corresponding to the first peak A has been reached, is stored. In addition, after the decision that the secondary battery 100 has reached the state corresponding to the first peak A (Yes) is made, the battery controller 230 provides control of the excessive charging until the secondary battery 100 reaches SOC 50% (see FIG. 7).

Next, the procedure proceeds to step W53 in which it is decided whether or not the secondary battery 100 reaches the state corresponding to the second peak B on the V–dQ/dV curve. More specifically, based on the dQ/dV value calculated every given time interval T, the battery controller 230 draws in real time a V–dQ/dV curve. And by comparison (by pattern matching) between this drawn V–dQ/dV curve and the V–dQ/dV curve K stored in the ROM 231, the battery controller 230 decides whether or not the secondary battery 100 reaches the state corresponding to the second peak B on the V–dQ/dV curve.

If the decision is that the state corresponding to the second peak B has not yet been reached (No), then the procedure returns back to the main routine shown in FIG. 18, and the processes of Steps W1-W4 are executed over again.

On the other hand, if the decision is that the state corresponding to the second peak B has been reached (Yes), then the procedure proceeds to step W54 in which the storage amount Q2 of each secondary battery 100, estimated at the time when the state corresponding to the second peak B has been reached, is stored. In addition, after the decision that the secondary battery 100 has reached the state corresponding to the second peak B (Yes) is made, the battery controller 230 provides control of the excessive discharging until the secondary battery 100 reaches SOC 50% (see FIG. 8).

Next, the procedure proceeds to step W55 in which the measured storage amount difference value ΔQS (=Q2−Q1), which is a difference value found by subtraction of the storage amount Q1 from the storage amount Q2, is calculated.

Thereafter, the procedure proceeds to step W56 in which there is made a comparison between the measured storage amount difference value ΔQS thus calculated and the reference stored amount charge difference value ΔQK stored in the ROM 231. In particular, the measured storage amount difference value ΔQS is divided by the reference storage amount difference value ΔQK, to thereby calculate a value for ΔQS/ΔQK.

Next, the procedure proceeds to step W57 in which it is decided whether or not the condition of ΔQS/ΔQK<1 is met. That is, it is decided whether or not the measured storage amount difference value ΔQS is smaller than the reference storage amount value ΔQK. If the decision is that ΔQS/ΔQK<1 is not met (No), then the procedure returns back to the main routine shown in FIG. 18 and the series of processes is brought to a stop.

On the other hand, if the decision is that the condition of ΔQS/ΔQK<1 is met (Yes), then the procedure proceeds to step W58 in which it is decided whether or not the condition of ΔQS/ΔQK>0.75 is met. That is, it is decided whether or not the measured storage amount difference value ΔQS exceeds 75% of the reference storage amount difference value ΔQK.

If the decision in step W58 is that the condition of ΔQS/ΔQK>0.75 is met (Yes), then the procedure proceeds to step W59 in which it is decided that there is a decrease in battery capacity of the secondary battery 100. On the other hand, if the decision is that the condition of ΔQS/ΔQK>0.75 is not met (No), then the procedure proceeds to step W5A in which it is decided that there is internal micro short-circuiting in the secondary battery 100. In this case, the procedure proceeds to step W5B to output a signal representing that the secondary battery 100 is malfunctioning, thereby prompting replacement of the secondary battery 100.

In the way as described above, in Embodiment 3, the state of the secondary battery system 36 (in particular, the decrease in battery capacity of the secondary battery 100 and internal micro short-circuiting in the secondary battery 100) is detected based on the definite peaks (the first peak A and the second peak B) appearing on the V−dQ/dV curve. Therefore, in Embodiment 3, it becomes possible to accurately detect a decrease in battery capacity of the secondary battery 100 and internal micro short-circuiting in the secondary battery 100 in spite of the use of the secondary battery 100 within the range in which the variation in battery voltage associated with the variation in SOC (the amount of stored charge) is small (in particular, within the SOC range of from 25% to 75%).

In Embodiment 3, further, the battery controller 230 corresponds to dQ/dV calculation means, control means, judgment means, capacity decrease detection means and micro short-circuiting detection means.

In the above, the present invention has been described in line with Embodiments 1-3. However, the present invention should not be construed to be limited in any way to these examples. Therefore, it is needless to say that the present invention may be modified appropriately and applicable within the scope not deviating from the sprit of the present invention.

Figure 15:
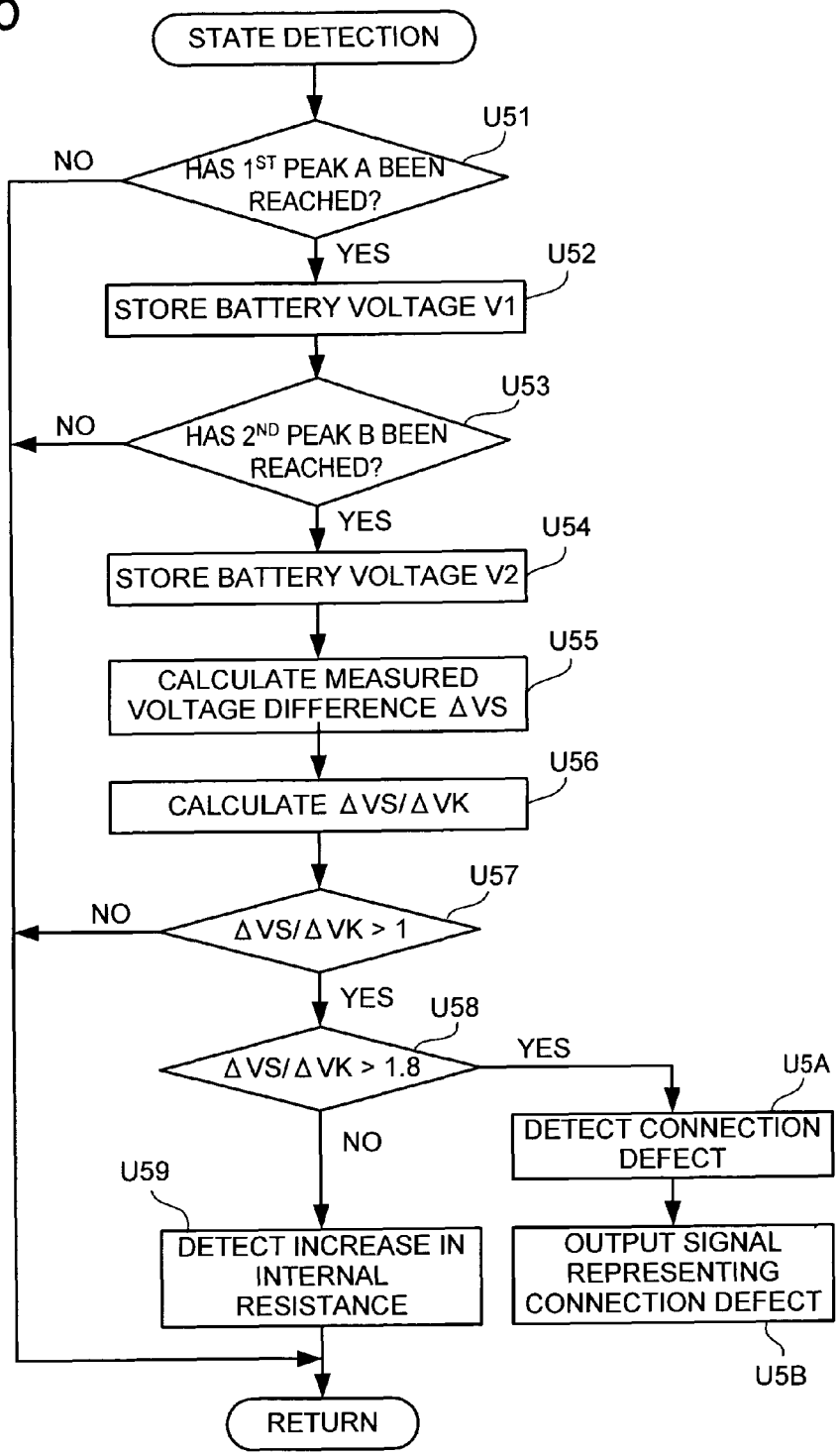
FIG. 15 is a sub-routine of the state detection of the secondary battery in Embodiment 2.

For example, in Embodiment 2, there is demonstrated, by way of example, a secondary battery system that is configured to detect an increase in internal resistance of the secondary battery and a connection defect in the secondary battery (see FIGS. 14 and 15). In addition, in Embodiment 3, there is demonstrated, by way of example, a secondary battery system that is configured to detect a decrease in battery capacity of the secondary battery 100 and internal micro short-circuiting in the secondary battery (see FIGS. 18 and 19). However, it is preferable that the secondary battery system is configured so as to conduct a state detection comprising a combination of the state detection of Embodiment 2 and the state detection of Embodiment 3. That is to say, it is preferable that the secondary battery system is configured so as to detect, in addition to detecting an increase in internal resistance of the secondary battery and a connection defect in the secondary battery (the processes of steps U51-U5B shown in FIG. 15), a decrease in battery capacity of the secondary battery and internal micro short-circuiting in the secondary battery (the processes of steps W51-W5B shown in FIG. 19).

EXPLANATION OF REFERENCE SIGNS 1, 101, 201 Hybrid electric vehicle
6, 26, 36 Secondary battery system
10 Assembled battery
30, 130, 230 Battery controller (dQ/dV calculation mean, judgment means, resistance increase detection means, connection defect detection means, capacity decrease detection means, micro short-circuiting detection means, and control means)
40 voltage detection means
50 electric current detection means
100 Secondary battery
153 Positive active material
154 Negative active material
155 Positive electrode plate
156 Negative electrode plate
157 Separator
A First peak
B Second peak

The invention claimed is:

1. A secondary battery system comprising a secondary battery, wherein
the secondary battery includes a positive active material formed of lithium manganate having a spinel crystal structure and a negative active material associated with change in phase due to charging and discharging,
the secondary battery system includes dQ/dV calculation means for calculating, during charging and discharging of the secondary battery, a value for dQ/dV representative of a ratio of dQ to dV where dQ is a variation in storage amount Q of the secondary battery and dV is a variation in battery voltage V of the secondary battery, and
a state of the secondary battery system is detected based on a peak appearing on a V−dQ/dV curve representative of a relationship between the battery voltage V value and the dQ/dV value.

2. The secondary battery system according to claim 1, wherein
the secondary battery system includes judgment means for deciding, based on the battery voltage V value and the dQ/dV value, whether or not the secondary battery reaches a state corresponding to a first peak appearing on the V−dQ/dV curve, and whether or not the secondary battery reaches a state corresponding to a second peak appearing on the V−dQ/dV curve and having the battery voltage V of higher level than the battery voltage V at the first peak, and the state of the secondary battery system is detected based on a measured voltage difference value which is a difference value between a battery voltage value V1 at the time when the judgment means decides that the secondary battery has reached said state corresponding to the first peak and a battery voltage value V2 at the time when the judgment means decides that the secondary battery has reached said state corresponding to the second peak.

3. The secondary battery system according to claim 2, wherein the secondary battery system includes resistance increase detection means for detecting an increase in internal resistance of the secondary battery, and the resistance increase detection means compares the measured voltage difference value with a reference voltage difference value which is prestored in the secondary battery system, the reference voltage difference value being a difference value between a battery voltage value V1 in regard to the first peak and a battery voltage value V2 in regard to the second peak, and relating to the secondary battery in its initial state, if the measured voltage difference value exceeds the reference voltage difference value, then the decision is that there is an increase in internal resistance of the secondary battery.

4. The secondary battery system according to claim 2, wherein the secondary battery system includes connection defect detection means for detecting a connection defect in the secondary battery, and the connection defect detection means compares the measured voltage difference value with a reference voltage difference value which is prestored in the secondary battery system, the reference voltage difference value being a difference value between a battery voltage value V1 in regard to the first peak and a battery voltage value V2 in regard to the second peak, and relating to the secondary battery in its initial state, if the measured voltage difference value exceeds not only the reference voltage difference value, but also exceeds a predetermined threshold, then the decision is that there occurs in the secondary battery a connection defect.

5. The secondary battery system according to claim 1, wherein the secondary battery system includes judgment means for deciding, based on the battery voltage V value and the dQ/dV value, whether or not the secondary battery reaches a state corresponding to a first peak appearing on the V–dQ/dV curve, and whether or not the secondary battery reaches a state corresponding to a second peak appearing on the V–dQ/dV curve and having the battery voltage V of higher level than the battery voltage V at the first peak, and the state of the secondary battery system is detected based on a measured storage amount difference value which is a difference value between a storage amount Q1 of the secondary battery at the time when the judgment means decides that the secondary battery has reached the aforesaid state corresponding to the first peak and a storage amount Q2 of the secondary battery at the time when the judgment means decides that the secondary battery has reached the aforesaid state corresponding to the second peak.

6. The secondary battery system according to claim 5, wherein the secondary battery system includes capacity decrease detection means for detecting a decrease in battery capacity of the secondary battery, and the capacity decrease detection means compares the measured storage amount difference value with a reference storage amount difference value which is prestored in the secondary battery system, the reference storage amount difference value being a difference value between a storage amount Q1 of the secondary battery at the first peak and a storage amount Q2 of the secondary battery at the second peak, and relating to the secondary battery in its initial state, if the measured storage amount difference value is smaller than the reference storage amount difference value, then the decision is that there is a decrease in battery capacity of the secondary battery.

7. The secondary battery system according to claim 5, wherein the secondary battery system includes micro short-circuiting detection means for detecting internal micro short-circuiting in the secondary battery, and the micro short-circuiting detection means compares the measured storage amount difference value with a reference storage amount difference value which is prestored in the secondary battery system, the reference storage amount difference value being a difference value between a storage amount Q1 of the secondary battery in regard to the first peak and a storage amount Q2 of the secondary battery in regard to the second peak, and relating to the secondary battery in its initial state, if the measured storage amount difference value falls below not only the reference storage amount difference value, but also below a predetermined threshold, then the decision is that there is an occurrence of internal micro short-circuiting in the secondary battery.

8. The secondary battery system according to claim 1, wherein the secondary battery system includes control means for controlling charging and discharging of the secondary battery, and the control means controls the charging and discharging of the secondary battery in order that the battery voltage V of the secondary battery has a value not exceeding a battery voltage value V2 at the second peak that is the larger, in battery voltage V, of the first and the second peaks appearing on the V–dQ/dV curve.

9. The secondary battery system according to claim 8, wherein the secondary battery system includes judgment means for deciding, based on the battery voltage V value and the dQ/dV value, whether or not the secondary battery reaches a state corresponding to the second peak on the V–dQ/dV curve, and if the judgment means decides that the secondary battery has reached the aforesaid state corresponding to the second peak during charging of the secondary battery, the control means brings the charging of the secondary battery to a stop and takes control of excessive discharging with respect to the secondary battery.

10. The secondary battery system according to claim 3, wherein the secondary battery system includes connection defect detection means for detecting a connection defect in the secondary battery, and the connection defect detection means compares the measured voltage difference value with a reference voltage difference value which is prestored in the secondary battery system, the reference voltage difference value being a difference value between a battery voltage value $V1$ in regard to the first peak and a battery voltage value $V2$ in regard to the second peak, and relating to the secondary battery in its initial state, if the measured voltage difference value exceeds not only the reference voltage difference value, but also exceeds a predetermined threshold, then the decision is that there occurs in the secondary battery a connection defect.

11. The secondary battery system according to claim 6, wherein the secondary battery system includes micro short-circuiting detection means for detecting internal micro short-circuiting in the secondary battery, and the micro short-circuiting detection means compares the measured storage amount difference value with a reference storage amount difference value which is prestored in the secondary battery system, the reference storage amount difference value being a difference value between a storage amount $Q1$ of the secondary battery in regard to the first peak and a storage amount $Q2$ of the secondary battery in regard to the second peak, and relating to the secondary battery in its initial state, if the measured storage amount difference value falls below not only the reference storage amount difference value, but also below a predetermined threshold, then the decision is that there is an occurrence of internal micro short-circuiting in the secondary battery.

\* \* \* \* \*